United States Patent
Yahata et al.

(10) Patent No.: US 6,563,759 B2
(45) Date of Patent: May 13, 2003

(54) SEMICONDUCTOR MEMORY DEVICE

(75) Inventors: Hideharu Yahata, Inagi (JP); Masashi Horiguchi, Koganei (JP); Hiroki Fujisawa, Sagamihara (JP); Tsugio Takahashi, Hachiouji (JP); Masayuki Nakamura, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/871,911

(22) Filed: Jun. 4, 2001

(65) Prior Publication Data
US 2002/0003747 A1 Jan. 10, 2002

(30) Foreign Application Priority Data
Jul. 4, 2000 (JP) ....................... 2000-202142

(51) Int. Cl.[7] ................................................. G11C 8/00
(52) U.S. Cl. .............. 365/233; 365/189.05; 365/230.08
(58) Field of Search ............................ 365/233, 189.05, 365/230.08

(56) References Cited

U.S. PATENT DOCUMENTS 5,544,124 A  8/1996 Zagar et al. ........... 365/230.08
6,151,270 A  11/2000 Jeong
6,344,763 B1 * 2/2002 Aritomi et al. ............. 327/283
6,373,783 B1 * 8/2002 Tomita ....................... 365/233

FOREIGN PATENT DOCUMENTS

| JP | 10504129 | 4/1998 |
| JP | 10162572 | 6/1998 |
| JP | 1166848 | 3/1999 |
| JP | 11224486 | 8/1999 |

* cited by examiner

Primary Examiner—Son T. Dinh
(74) Attorney, Agent, or Firm—Antonelli, Terry, Stout & Kraus, LLP

(57) ABSTRACT

In a clock synchronous memory like a double data rate synchronous DRAM, a register is provided which is capable of setting a value (advanced latency) for specifying an input or entry cycle for a read or write command. Further, a timing adjustment register (124, 125) for delaying a signal by a predetermined cycle time according to the advanced latency set to the register is provided on a signal path in a column address system, which is formed between a column address latch circuit (110) and a column decoder (116).

25 Claims, 30 Drawing Sheets

FIG. 16

| COMMAND | SYMBOL | CKE | /CS | /RAS | /CAS | /WE | BA1 | BA0 | AP | ADDRESS |
|---|---|---|---|---|---|---|---|---|---|---|
| MODE REGISTER SET | MRS | H | L | L | L | L | L | L | L | V |
|  | EMRS | H | L | L | L | L | L | H | L | V |
| COLUMN ADDRESS AND READ COMMAND | READ | H | L | H | L | H | V | V | L | V |
| COLUMN ADDRESS AND WRITE COMMAND | WRITE | H | L | H | L | L | V | V | L | V |
| ROW ADDRESS STROBE AND BANK ACTIVE | ACTV | H | L | L | H | H | V | V | V | V |

FIG. 17A

| A14 (BA0) | A13 (BA1) | A12 | A11 | A10 | A9 | A8 | A7 | A6 | A5 | A4 | A3 | A2 | A1 | A0 |
|---|---|---|---|---|---|---|---|---|---|---|---|---|---|---|
| 0 | 0 | 0 | 0 | 0 | 0 | 0 | 0 | LMODE | | | BT | BL | | |
| | | | | | | | | DR | | | | | | |

MRS

| CAS LATENCY | A6 | A5 | A4 |
|---|---|---|---|
| 2 | 0 | 1 | 0 |
| 3 | 0 | 1 | 1 |

FIG. 17B

| A14 (BA0) | A13 (BA1) | A12 | A11 | A10 | A9 | A8 | A7 | A6 | A5 | A4 | A3 | A2 | A1 | A0 |
|---|---|---|---|---|---|---|---|---|---|---|---|---|---|---|
| 1 | 0 | 0 | 0 | 0 | 0 | 0 | 0 | 0 | 0 | 0 | AL | | | DLL |

EMRS

| ADDITIVE LATENCY | A3 | A2 | A1 |
|---|---|---|---|
| 0 | 0 | 0 | 0 |
| 1 | 0 | 0 | 1 |
| 2 | 0 | 1 | 0 |

SEMICONDUCTOR MEMORY DEVICE

BACKGROUND

The present invention relates to a semiconductor memory device which performs a read/write operation in a pipeline system in synchronism with a clock signal, and to a technology effective for application to, for example, a synchronous DRAM (Dynamic Random Access Memory) or a double data rate synchronous DRAM or the like.

With a rapid increase in operating frequency of a processor, there has also recently been a growing demand for the speeding up of a data transmission rate as well as the shortening of an access time as a demand for a DRAM. A synchronous DRAM operated in synchronism with a clock signal (hereinafter abbreviated as "clock") has been developed with its demand. A DDR (Double Data Rate) type synchronous DRAM or the like for performing the input/output of data on the rising and falling edges of the clock has been proposed to achieve its further speeding up, which is becoming mainstream therefor.

The double data rate synchronous DRAM having such a configuration has been disclosed in 1999 ISSCC Digest of Technical Papers, p.412-p.413 (1999 IEEE Internal Solid-State Circuit Conference WP24.2 "A 2.5 V 333Mb/s/pin 1 Gb Double Date Rate SDRAM", p.412-p.413).

Unexamined Patent Publication No. Hei 10-504129 (corresponding U.S. Pat. No. 5,544,124) discloses an optimizing circuit for a synchronous memory device having a programmable latency time. Unexamined Patent Publication No. Hei 10-162572 discloses a data transmission system capable of coping with various latency demands. Unexamined Paten Publication No. Hei 11-224486 (corresponding U.S. Pat. No. 6,151,270) discloses a synchronous memory device which controls activating/non-activating times of a column select signal according to a value corresponding to a CAS latency during a read operation. Unexamined Patent Publication No. Hei 11-66848 discloses a semiconductor memory device capable of operation with a sufficient margin of cycle time.

SUMMARY OF THE INVENTION

FIG. 29 shows a configuration of a double data rate synchronous DRAM discussed by the present inventors, FIG. 30 shows a timing chart at its read operation, and FIG. 31 shows a timing chart at its write operation, respectively. The following problems discussed by the present inventors and the analysis of causes of the problems are part of the present invention.

The semiconductor memory device shown in FIG. 29 comprises a memory cell array 123, an address buffer 101 which latches an address inputted from outside, an address register 103 which latches the address captured by the address buffer 101, a row address decoder 109 which decodes a row address to thereby select a word line, a column address decoder 116 which decodes a column address to thereby select at least one bit line, a row address latch 104 which transmits a row address to the row address decoder 109 in response to the output of the address buffer 101, a column address counter 111 which changes a column address thereinside, a column address latch 110 which transmits a column address to the column address counter 111 in response to the output of the address buffer 101, a command decoder 102 which generates internal control signals in response to control signals supplied from outside, an output buffer 120 which outputs data read from the memory cell array 123 to the outside, an output clock generator 119 which controls timing for data outputted from the output buffer 120, an input buffer 121 which receives data inputted from the outside, a read/write circuit 117 which transmits data read from the memory cell array 123 to the output buffer 120 or writing data inputted from the input buffer 121 into the memory cell array 123, etc. One feature of the synchronous DRAM resides in that a CAS latency (corresponding to the number of clock cycles set from the capturing of a column address to the output of read data) can be set based on command codes (hereinafter called simply "commands").

A read operation of data by the DRAM shown in FIG. 29 will be explained with reference to FIG. 30. FIG. 30 is a timing chart at the time that the number of clock cycles (tRCD) set from an ACTV command for providing instructions for the start of operation to a READ command or a WRITE command (called a column command where both commands are distinguished from each other) for providing read or write instructions is 2 cycles and a CAS latency is 2 cycles. As shown in FIG. 30, a row address is taken in from the address buffer 101 simultaneously with the time when an ACTV command is inputted. In response to the ACTV command, the row address is latched into the address register 103 according to ACLK outputted from a command decoder 102. Further, the row address is latched into the row address latch 104 according to a clock RCLK outputted from the command decoder 102 in response to the ACTV command. Afterwards, the rod decoder 109 decodes the row address signal to thereby select a word line corresponding to the value of the row address. When the corresponding word line is selected, data is outputted from a memory cell connected to the selected word line to at least one bit line. When the data is fully outputted to the bit line, a sense amplifier is started up so that the potential on the bit line is amplified.

A READ command is inputted after the elapse of two cycles since the entry of the ACTV command. Simultaneously with it, a column address is taken in from the address buffer 101. In response to the READ command, the column address is latched into the address register 103 according to a clock ACLK outputted from the command decoder 102. Further, the column address is latched into the column address latch 110 according to a clock YCLK1 outputted from the command decoder 102 in response to the READ command. Afterwards, the column address signal passes through the column address counter 111 and is decoded by the column decoder 116 to thereby select at least one bit line corresponding to the value of the column address. At this time, a bit-line selectable condition is that the potential on at least one bit line has fully been amplified. After the selection of the bit line, data on the bit line passes through the read circuit 117 and is outputted to the outside through the output buffer 120. At this time, the timing provided to output read data to the outside through the output buffer 120 is determined according to QCLK1 generated from the output clock generator 119. In the double data rate synchronous DRAM, 2n-bit data equivalent to twice the number of output bits (n) are read from the read circuit 117 to the output buffer 120, and the data are outputted by n bits in synchronism with the rising and falling edges of the clock. Incidentally, a column decoder input and a column select signal are shown in FIG. 30 two by two because continuous addresses are generated from the column address counter 111 in a burst mode or the like and the read operation is carried out based on the same addresses.

FIG. 31 shows a timing chart at a data writing of the DRAM shown in FIG. 29 where tRCD is 2 cycles and a CAS latency is 1 cycle. As shown in FIG. 31, a row address is taken in simultaneously with the entry of an ACTV command upon writing. The row address is decoded by the row decoder 109 to select a word line. Data stored in a memory cell is outputted to at least one bit line. When the bit line is fully set up, a sense amplifier is started up to amplify the potential on the bit line.

A WRITE command is inputted after the elapse of 2 cycles since the entry of the ACTV command. Simultaneously with the entry of the WRITE command, a column address is taken in. Afterwards, the column address is decoded in a manner similar to the reading to thereby select at least one bit line. Write data is captured from outside in 1 cycle=(CAS latency-1) since the entry of the WRITE command. In the double data rate synchronous DRAM at this time, n-bit write data are respectively taken in by the input buffer 121 on both the rising and falling edges of the clock and sent to the memory cell array 123 through the write circuit 117 as 2n bits, followed by writing into the corresponding memory cell through the selected at least one bit line.

The double data rate synchronous DRAM has an advantage in that the output of the read data and the capturing of the write data are carried out on both the rising and falling edges of the clock, a data transmission rate is improved. However, the double data rate synchronous DRAM is accompanied by a problem that since one cycle is made blank between the input of the ACTV command and the input of the column command as shown in FIGS. 30 and 31 as to the commands, the efficiency of transfer of each command is low and a CPU outputs the column command after having waited for one cycle after the output of the ACTV command, whereby the performance of the entire system is not sufficiently enlarged.

Therefore, a discussion has been made of a synchronous DRAM of such a type that the timing provided to input a column command inputted after the entry of the ACTV command is inputted in a once-cycle advanced state. An advantage is obtained in that since the CPU is capable of making a transition to another process early by one cycle because the entry timing of the column command is advanced by one cycle, the performance of the overall system is improved. In this case, however, the support for various systems can be achieved by varying the advanced latency.

However, it has been found that the double data rate synchronous DRAM or the like having such a configuration as shown in FIG. 29 is not able to realize or implement such an advanced entry of column command. Described specifically, when the READ command is inputted in advanced manner, the column address is also inputted in advanced manner, so that at least one bit line is selected before the amplification of data on the bit line by the sense amplifier. As a result, correct data is not read out. Further, the bit line is selected before the input of correct write data into the write circuit due to the advanced entry of the WRITE command, so that no correct data is written therein.

An object of the present invention is to provide a clock synchronous type semiconductor memory device capable of reading and writing correct data even when a read command and a write command are inputted in advanced manner and a column address is inputted in advanced manner.

Another object of the present invention is to provide a clock synchronous type semiconductor memory device capable of shortening a cycle time and thereby speeding up a data transmission rate.

The above, other objects and novel features of the present invention will become apparent from the description of the present specification and the accompanying drawings.

Summaries of typical ones of the inventions disclosed in the present application are as follows:

In order to achieve the above objects, there is provided a semiconductor memory device according to the present invention, wherein in a semiconductor memory like a double data rate synchronous DRAM, a register capable of setting a value (advanced latency) for specifying an entry cycle of a read or write command is provided, and a timing adjustment register for delaying a signal by a predetermined cycle time according to the advanced latency set to the register is provided on a signal path in a column address system between a column address latch circuit and a column decoder.

Namely, there is provided a semiconductor memory device comprising a memory cell array having a plurality of word lines and a plurality of bit lines to which memory cells are connected, a row address latch circuit which latches a row address inputted from outside, a row decoder which decodes the row address to thereby select a word line lying within the memory cell array, a column address latch circuit which latches a column address inputted from outside, a column decoder which decodes the column address to thereby select at least one bit line lying within the memory cell array, an output buffer which outputs data read from the memory cell array, an input buffer which captures input data, and a first register capable of setting values for specifying a timing provided to take the data in the input buffer and a timing provided to output the data from the output buffer. Further, the semiconductor memory device wherein the input buffer and the output buffer are configured so as to determine their operating timings according to the values set to the first register, is provided with a second register capable of setting a value for specifying a timing provided to input a data read command or a data write command, and a timing adjustment circuit provided on a column address signal path between the column address latch circuit and the column decoder and for delaying a signal by a predetermined time according to the value set to the second register.

According to the above means, since the timing adjustment circuit is capable of controlling a propagation delay time for a column address signal according to the value (the value of column command advanced latency) set to the second register, the selection of at least one bit line by the column address decoder can be carried out in accordance with timing provided to amplify the potential on the bit line even where the column address is captured in advanced manner due to the advanced entry of the read command or the write command (column command), and hence correct data can be read out. Further, since the corresponding bit line is selected after the write data has been captured by the input buffer, correct data can be written into a memory cell connected to the selected word line.

Even if each value (CAS latency) set to the first register is changed, the value (the value of column command advanced latency) set to the second register is independently set. Thus, since the timing adjustment circuit is also controlled independently, the proper operation is assured. Further, even when the value (CAS latency) set to the first register remains uncharged and the value (the value of column command advanced latency) set to the second register is changed, the propagation delay time for the column address signal is adjusted by the timing adjustment circuit controlled independently of the set value (CAS latency) of the first register. Further, since the corresponding bit line can be selected in accordance with the timing provided to amplify the potential on the bit line and the timing provided to input the write data, the proper operation is assured.

Preferably, the semiconductor memory device is provided with a circuit which generates an internal control signal used to control each internal circuit, based on a control signal supplied from outside, and a delay control circuit for delaying the internal control signal by a predetermined cycle time according to the value set to the second register. Further, the timing adjustment circuit is controlled by the internal control signal adjusted by the delay control circuit so as to make a timing adjustment to a column address signal. Thus, each signal for controlling the timing control circuit can be generated with satisfactory efficiency systematically.

Further, preferably, the semiconductor memory device is provided with a circuit which generates a signal for supplying a timing provided to operate the output buffer, based on the internal control signal. Further, the circuit is controlled by the internal control signal generated by the delay control circuit and is configured so as to be capable of delaying a signal generated according to the value set to the second register. Thus, the timing adjustment circuit and the circuit for generating the signal for supplying the timing provided to operate the output buffer can be controlled by a common signal, and hence the configuration of the control circuit can be simplified.

Incidentally, the position to place the timing adjustment circuit may be any location so long as the timing adjustment circuit is placed between the column address latch circuit and the column decoder. It is however desirable that when a column address counter for automatically updating the column address latched into the column address latch circuit is provided, the timing adjustment circuit is provided on the column address signal path between the column address counter and the column decoder or between the column address latch circuit and the column address counter. Thus, in the semiconductor memory device operated in synchronism with the clock, the operation of performing address latch and address updating, and the operation of decoding the column address are executed distributedly over other cycles to thereby allow the shortening of a cycle time.

When the semiconductor memory device is further provided with a plurality of spare memory arrays capable of being substituted for normal memory arrays in the memory cell array, a relief address storage circuit capable of storing addresses lying in a memory array having a defect, an address comparator which compares an input column address and each of the addresses stored in the relief address storage circuit, and a redundant column decoder which decodes a signal based on the result of comparison by the address comparator to thereby select any of the spare memory arrays, the column address comparator may be configured so as to compare an address outputted from the column address counter and each address stored in the relief address storage circuit, and a second timing adjustment circuit may be provided on a signal path between the address comparator and the redundant column decoder. Providing the second timing adjustment circuit makes it possible to more optimally control the timing provided to transmit a column address signal. In the semiconductor memory device operated in synchronism with the timing clock, the operation of performing address latch and address updating, the operation of performing an address comparison, and the operation of decoding the column address are executed distributedly over other cycles to thereby allow the shortening of a cycle time.

Further, when a column predecoder for predecoding the column address is provided in a stage preceding the column decoder, the timing adjustment circuit is provided between the column address counter and the column predecoder, and the second timing adjustment circuit is provided between the column address comparator and the column predecoder, respectively. The number of the timing adjustment circuits increases as they approach the column decoder. Owing to such a configuration, however, a cycle time can be shortened without an increase in circuit scale of each timing adjustment circuit.

However, when the column predecoder for predecoding the column address is provided in the stage preceding the column decoder, the timing adjustment circuit may be provided between the column predecoder and the column decoder, and the second timing adjustment circuit may be provided between the column address comparator and the column decoder, respectively. Since the timing adjustment circuit becomes easy to make the optimum operation distribution as it approaches the column decoder, a cycle time can further be shortened owing to such a configuration although a circuit scale slightly increases.

In addition, when the semiconductor memory device is further provided with a plurality of spare memory arrays capable of being substituted for normal memory arrays in the memory cell array, a relief address storage circuit capable of storing memory addresses lying in a memory array having a defect, an address comparator which compares an input column address and each of the addresses stored in the relief address storage circuit, and a redundant column decoder which decodes a signal based on the result of comparison by the address comparator to thereby select any of the spare memory arrays, a third timing adjustment circuit may be provided between the column address latch circuit and the address comparator. Thus, the optimum operation distribution is further allowed and a cycle time can further be shortened.

In the case of a semiconductor memory device operated based on commands supplied from outside, the value set to the second register is defined as a value for specifying the number of cycles in which the read or write command inputted after the entry of an operation start command is to be inputted in advanced manner. Thus, the clock synchronous memory like the known double data rate synchronous DRAM makes it possible to shorten a cycle time.

Further, the value set to the second register is set based on the state of a terminal to which an external address is inputted when the command supplied from the outside provides instructions for setting thereof to the second register. Thus, the setting thereof to the second register can be carried out without providing any additional external terminal.

Preferably, the timing adjustment circuit comprises at least one delay path having signal delay means, a through path which has no signal delay means and outputs an input signal as it is, and switching means which selects any of the plural paths, for causing the input signal to pass therethrough according to the value set to the second register. Thus, an easy-to-control timing adjustment circuit can be implemented with a relatively simple circuit configuration.

More preferably, master slave-configured latch circuits each operated by the internal control signal are placed in the delay path having the signal delay means of the timing adjustment circuit. It is thus possible to reliably prevent a desired delay from being unavailable due to the sneaking-through of an input signal from an input terminal of the timing adjustment circuit to its output terminal, which is caused by the cue or the like of a clock signal for controlling a circuit.

BRIEF DESCRIPTION OF THE DRAWINGS

FIG. 5 is a circuit configurational diagram showing a clocked inverter which constitutes a row address latch or the like;

FIG. 16 is a command configurational diagram showing the relationship between the type of command and command codes employed in the double data rate synchronous DRAM according to the first embodiment;

FIGS. 17A and 17B are respectively explanatory views showing an example (FIG. 17A) indicative of values set by an extended mode register set command and an example (FIG. 17B) indicative of values set by a mode register set command;

DETAILED DESCRIPTION

Preferred embodiments of semiconductor devices according to the present invention will hereinafter be described with reference to the accompanying drawings.

Figure 1:
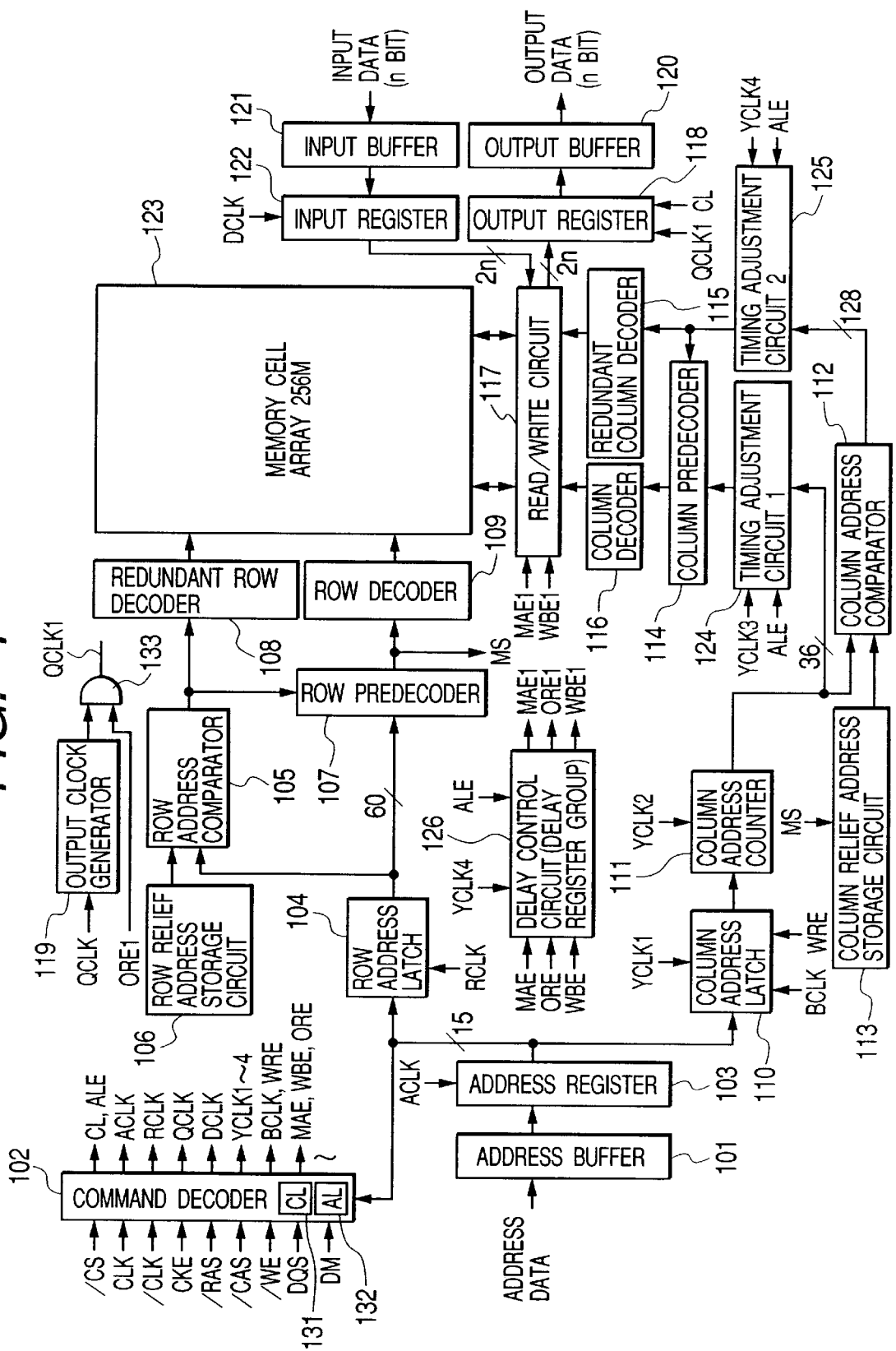
FIG. 1 is a block configurational diagram showing a first embodiment of a double data rate synchronous DRAM used as one example of a semiconductor memory device to which the present invention is applied.

FIG. 1 is a block diagram showing a first embodiment of a double data rate synchronous DRAM to which the present invention is applied.

The DRAM shown in FIG. 1 comprises a memory cell array 123 which is comprised of, for example, four banks in which a plurality of memory cells are arranged in matrix form, and which has a storage capacity like 256 Mbits as a whole, an address buffer 101 for taking in address data (hereinafter abbreviated as "addresses") inputted from outside in a multiplex system, an address register 103 for latching the addresses captured by the address buffer 101, a row address latch 104 for latching a row address of the addresses latched into the address register 103, a row relief address storage circuit 106 for storing a relief address for each row address through the use of a fuse, a row address comparator 105 for comparing the relief address and the row address, a row address predecoder 107 for predecoding a row address, a redundant row address decoder 108 and a row address decoder 109 for decoding the row address and selecting a corresponding word line lying within the memory cell array 123, a column address latch 110 for latching a column address of the addresses latched into the address register 103, a column address counter 111 for automatically updating the latched column address thereinside, a column relief address storage circuit 113 for storing a relief address for each column address, a column address comparator 112 for comparing the relief address and the column address, a column address predecocer 114 for predecoding a column address, a redundant column address decoder 115 and a column address decoder 116 for decoding the column address and selecting a corresponding column (bit line) lying within the memory cell array 123, a command decoder 102 for generating internal control signals in response to control signals such as a chip select signal /CS, etc. inputted from outside, an output buffer 120 for outputting data read from the memory cell array 123 to the outside, an output register 118 for controlling timing provided to send data to the output buffer 120 according to the value of CAS latency, an output clock generator 119 for controlling timing provided for the data outputted from the output register 118, an input buffer 121 for receiving data from outside, an input register 122 for controlling timing provided to send the data outputted from the input buffer 121 to the memory cell array 123 according to the value of the CAS latency, and a read/write circuit 117 for transmitting data read from the memory cell array 123 to the output register 118 and writing data outputted from the input register 122 into the memory cell array 123.

As the control signals inputted to the command decoder 102 from outside, may be mentioned, for example, in addition to the chip select signal /CS for bringing a chip into a selected state, a pair of clocks CLK and /CLK opposite in phase to each other, a clock enable signal CKE indicative of the validity of a clock, a row address strobe signal/RAS (hereinafter called a "RAS signal"), a column address strobe signal /CAS (hereinafter called a "CAS signal"), a write enable signal /WE for providing instructions for a data write operation, a data strobe signal DQS for giving instructions for the input/output of data, a data mask signal DM for prohibiting the input/output of data, etc. Of these signals, those to which "/" is affixed in front of codes, means that a low level is an effective or valid level. The command decoder 102 decodes some of CKE, /CS, /RAS, /CAS, /WE and address signals of these control signals to understand or interpret the input commands, thereby generating and outputting signals CL and ALE indicating that the CAS latency or the like has been set, internal control signals MAE and WBE for giving timing provided to read data from the read/write circuit 117 and write it thereinto, a control signal WRE for giving latch timing for the column address latch circuit 110, etc. Further, the command decoder 102 generates a plurality of types of internal clocks ACLK, BCLK, QCLK, RCLK, DCLK and YCLK1 through YCLK4 different in phase and cycle from one another, based on the clocks CLK and /CLK and supplies them to desired internal circuits. The command decoder 102 is provided therewithin with a CL setting register 131 for holding a value CL of CAS latency, which is set according to an MRS command used for providing instructions for the setting to a mode register, of the input commands.

In the present embodiment, the command decoder 102 is provided therewithin with an AL setting register 132 for holding a value AL indicative of what cycles the normal column command input cycle with respect to a column command advanced latency, i.e., an ACTV command set by the MRS command used for providing the instructions for the setting to the mode register should be put ahead.

Further, there is provided the output clock generator 119 which comprises the known DLL (Digital Locked Loop) circuit or the like for forming a signal QCLK1 for providing latch timing for the output register 118, based on the clock QCLK generated from the command decoder 102. The DLL circuit is a circuit which comprises a variable delay circuit capable of changing a transmission delay time of a signal, and a replica circuit configured so as to become equal in delay time to an original read signal path, and which is configured so as to be capable of comparing the phase of a signal inputted to the variable delay circuit and the phase of a signal obtained by further delaying the signal transmitted through the variable delay circuit through the replica circuit, and adjusting or controlling the delay time of the variable delay circuit so that the phases thereof coincide with each other.

In the present embodiment, a two-input AND gate 133, which inputs a signal generated by the output clock generator 119 and a signal ORE1 delayed by a delay control circuit 126, is provided in a stage subsequent to the output clock generator 119. When the signal ORE1 is enabled (high in level), the output of the output clock generator 119 is outputted as QCLK1, whereas when the signal ORE1 is disabled (low in level), QCLK1 is fixed to a low level.

Further, a first timing adjustment circuit 124 for providing a delay corresponding to the set advanced latency AL is placed in a stage preceding the column predecoder 114, and a second timing adjustment circuit 125 having a similar function is disposed between the column address comparator 112 and the column predecoder 114. There is also provided the delay control circuit 126 for forming signals MAE1, ORE1 and WBE1 obtained by suitably delaying the timing control signals MAE, ORE and WBE outputted from the command decoder 102 in a manner similar to above, based on the clock YCLK4 and control signal ALE outputted from the command decoder 102.

Figure 2:
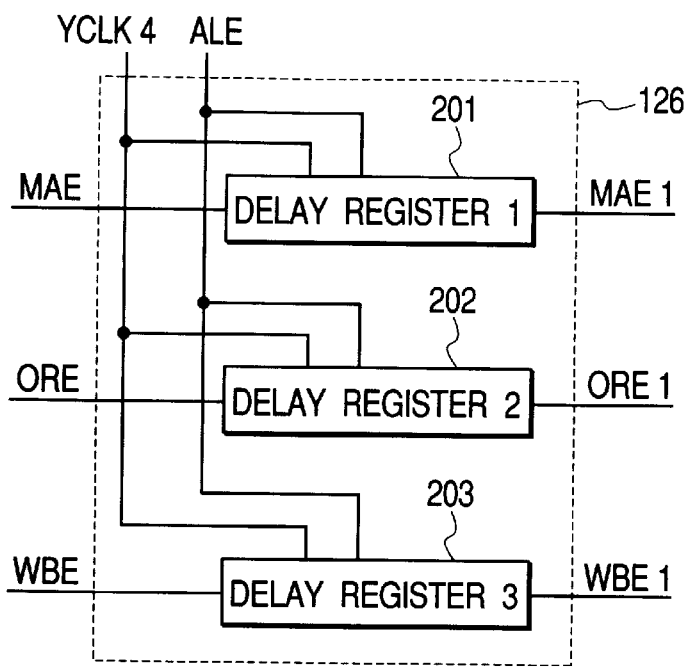
FIG. 2 is a circuit block diagram illustrating an example of a configuration of a delay control circuit shown in FIG. 1.

FIG. 2 shows a specific circuit example of the delay control circuit 126.

Figure 3A:
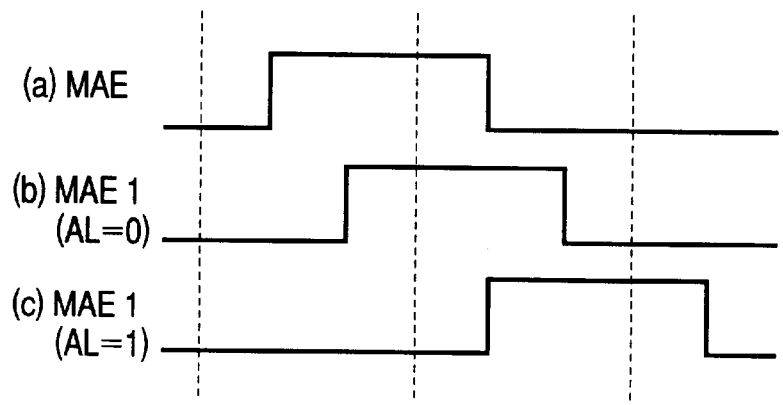
FIGS. 3A and 3B are respectively timing charts showing timings provided for input and output signals of the delay control circuit shown in FIG. 2.

The delay control circuit 126 comprises one-bit delaying registers 201, 202 and 203 which input the signals MAE, ORE and WBE supplied from the command decoder 102 and receives the internal clock YCLK4 and signal ALE as control signals therein. These registers 201 through 203 are those for respectively delaying the input signals MAE, ORE and WBE according to the signal ALE. Of theses, the register 201 is configured in such a manner that as indicated by (b) of FIG. 3A, it is brought into a signal through state when the signal ALE is low in level, i.e., AL is "0" to thereby output the input signal MAE as a signal MAE1 obtained by slightly delaying the input signal MAE, whereas when the signal ALE is high in level, i.e., AL is "1", it latches the input signal MAE in response to the clock YCLK4 and outputs the input signal MAE as a signal MAE1 obtained by delaying the input signal MAE by one cycle of the clock.

Figure 3B:
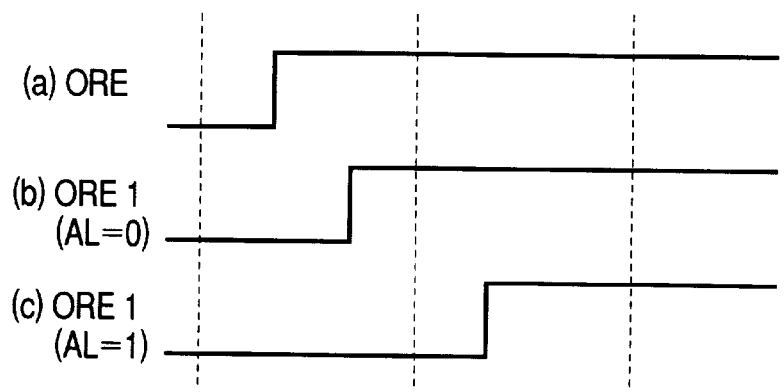

The register 202 is configured in such a manner that as indicated by (b) of FIG. 3B, it is brought into a signal through state when AL is "0" to thereby output the input signal ORE as a signal ORE1 obtained by slightly delaying the input signal ORE, whereas when AL is "1", it latches the input signal ORE in response to the clock YCLK4 and outputs the input signal ORE as a signal ORE1 obtained by delaying the input signal ORE by one cycle of the clock. Incidentally, since the signal WBE is delayed by the register 203 in a manner similar to the signal MAE, the illustration thereof will be omitted.

Further, since the ORE1 delayed by the register 202 is inputted to the input AND gate 133 provided in the stage subsequent to the output clock generator 119, the input AND gate 133 is operated so as to output the signal generated by the output clock generator 119 as a signal QCLK1 obtained by slightly delaying the generated signal when AL is "0". When AL is "1", the input AND gate 133 is operated so as to output the generated signal as a signal QCLK1 obtained by delaying it by one cycle of the clock. Since the signal QCLK inputted to the output clock generator 119 is a clock herein, the output signal QCLK1 takes a waveform similar to the signal MAE1 shown in FIG. 3A according to AL.

Figure 4:
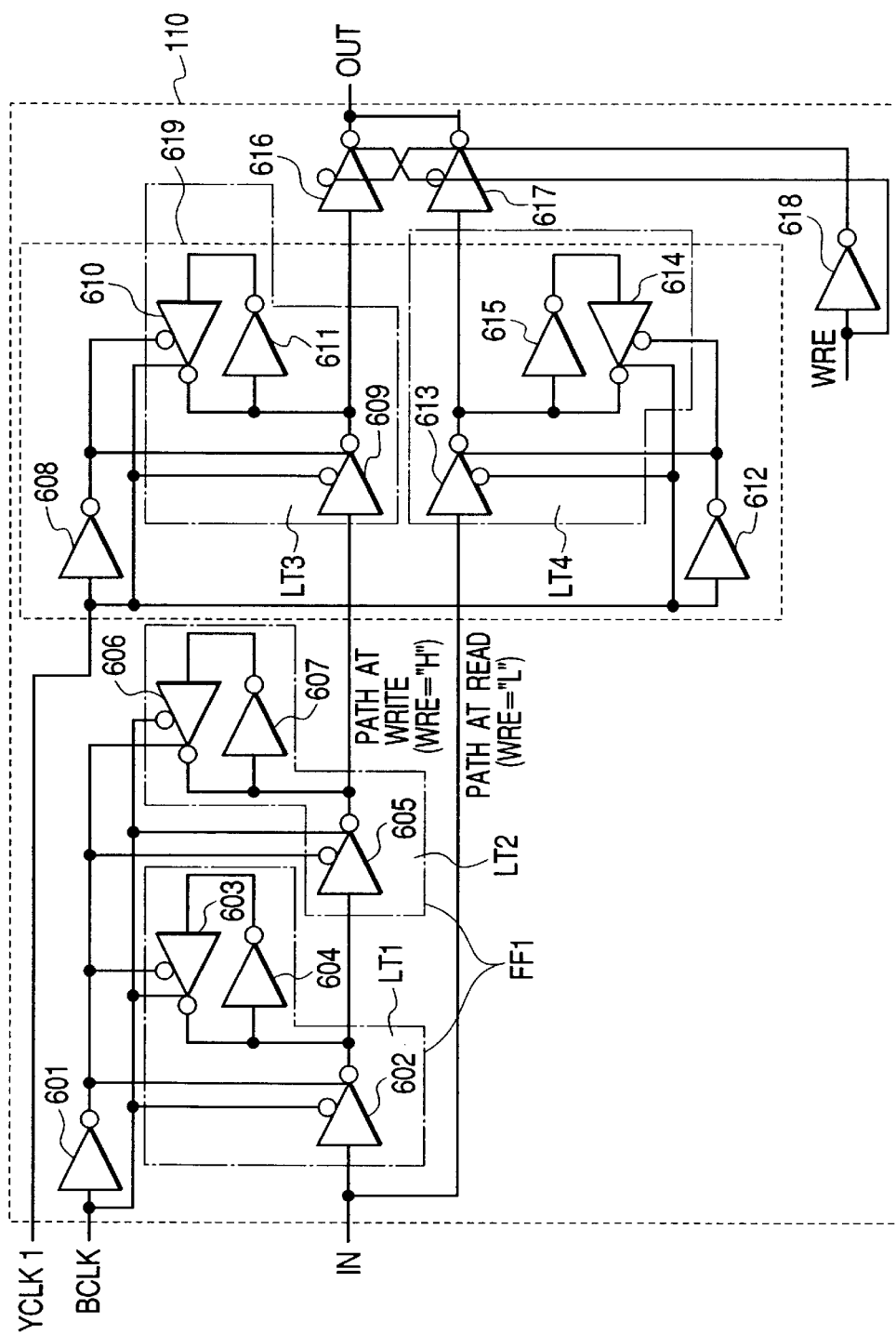
FIG. 4 is a circuit diagram illustrating a specific example of a row address latch.

FIG. 4 shows a specific circuit configurational example of the column address latch 110. Incidentally, the column address latch 110 has a configuration corresponding to an address one bit. The number of bits corresponding to column addresses provides such a circuit.

The address latch circuit 110 shown in FIG. 4 comprises a master slave-configured flip-flop FF1 which comprises a master latch LT1 comprised of clocked inverters 602 through 604 and operated by a clock BCLK, and a slave latch LT2 made up of clocked inverters 605 through 607 and operated by the clock BCLK, a latch LT3 which is made up of clocked inverters 609 through 611 and operated by a clock YCLK1 with the output of the preceding-stage flip-flop FF1 as the input, and a latch LT4 which comprises clocked inverters 612 through 615 and is operated by the clock YCLK1 with a signal identical to the input or entry of the flip-flop FF1 as the input. Further, the address latch circuit 110 is provided, at its output portion, with clocked inverters 616 and 617 each of which selects and outputs a signal outputted from the latch LT3 or LT4 according to the control signal WRE sent from the command decoder 102.

One bit for a column address is supplied to the circuit shown in FIG. 4 as the input signal IN and latched into the flip-flop FF1. Since, however, the output is selected according to the level of the control signal WRE, the inverter 616 is rendered effective upon data writing at which the control signal WRE is brought to a high level, so that the address latched into the flip-flop FF1 is outputted. Upon data reading at which the control signal WRE is brought to a low level, the inverter 617 is rendered effective, so that each address sent via the latch LT4 alone is outputted. Thus, the column address latch circuit 110 is controlled so as to transmit the input address to an output terminal OUT with timing delayed by one cycle, i.e., one cycle of the clock BCLK upon the data writing as compared with upon the data reading.

Figure 5:
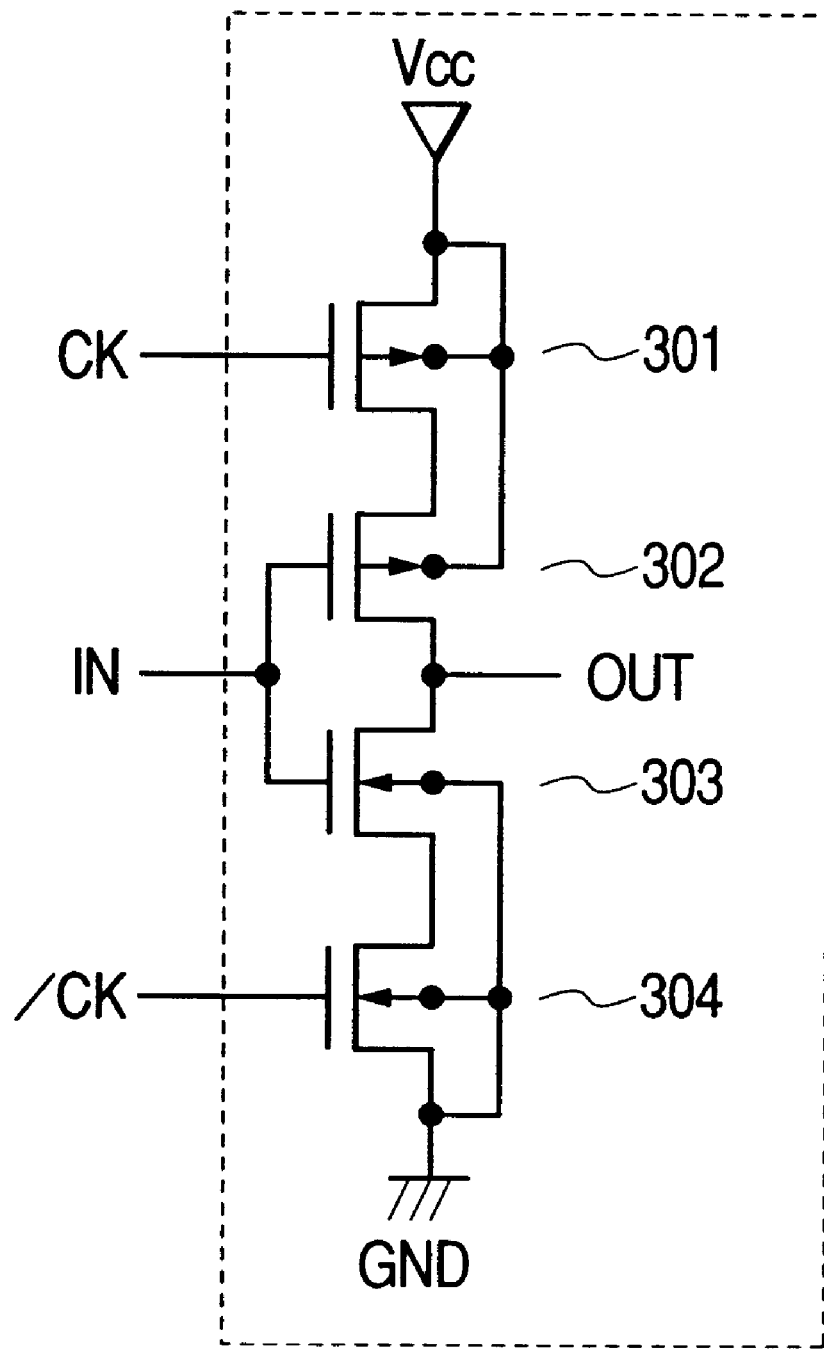

Incidentally, in FIG. 4, designated at numerals 604, 607, 611 and 615 of the inverters that constitute the respective latches LT1 through LT4, are normal two-elements type CMOS inverters, and those other than them and the output selecting inverters 616 and 617 are of clocked inverters. Further, the inverters 601, 608 and 612 are used to form clocks opposite in phase to the clocks BCLK and YCLK1 for the purpose of the control on the clocked inverters. Reference numeral 618 indicates an inverter used to form a signal opposite in phase to the control signal WRE. They are made up of normal inverters. FIG. 5 shows a specific example of the clocked inverter employed in the present embodiment.

As shown in FIG. 5, the clocked inverter comprises P channel MOSFETs 301 and 302, and N channel MOSFETs 303 and 304 both connected in series form between a source voltage Vcc and a ground potential GND. An input signal is applied to gate terminals of the MOSFETs 302 and 303, and clocks CK and /CK opposite in phase to each other are applied to gate terminals of the MOSFETs 301 and 304, so that a current is cut off or blocked during a period in which the clock CK is high in level, to thereby deactivate the clocked inverter as an inverter. Here, CK corresponds to the clocks BCLK and YCLK1 in the circuit shown in FIG. 4.

Figure 6:
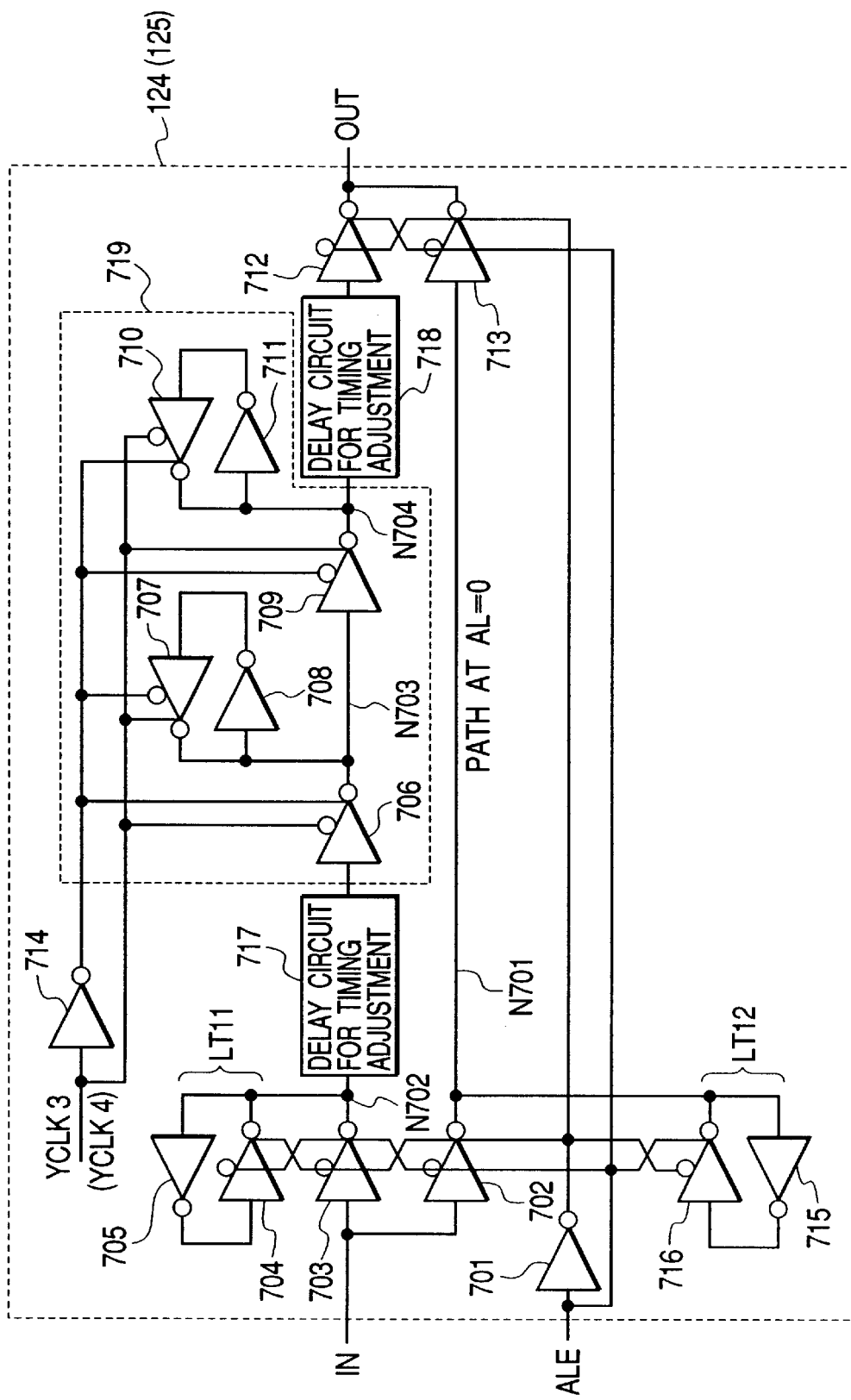
FIG. 6 is a circuit diagram illustrating one specific example of a timing adjustment circuit shown in FIG. 1.

FIG. 6 shows a specific circuit configurational example of each of the timing adjustment circuits 124 and 125 shown in FIG. 1. Incidentally, the circuit shown in FIG. 6 has a configuration corresponding to an address one-bit. The timing adjustment circuit 124, i.e., such a circuit is provided by the number of bits for column addresses. Further, the timing adjustment circuit 125, i.e., such a circuit is provided by the number of auxiliary or spare memory arrays (32×4=128).

The timing adjustment circuit shown in FIG. 6 has clocked inverters 702 and 703 for complementarily transmitting an input signal IN according to a timing signal ALE, a latch LT11 which comprises a clocked inverter 704 and an inverter 705 and latches the input signal IN according to a control signal ALE sent from the command decoder 102, a latch LT2 which is made up of an inverter 715 and a clocked inverter 716 and latches the input signal IN complementarily to the LT11 according to the timing signal ALE, a first delay circuit for timing adjustment 717 for delaying the signal that has passed through the clocked inverter 703, a register 719 comprised of master slave-configured flip-flops, which is made up of inverters 706 through 711 and operated by a clock YCLK3 or YCLK4 to thereby latch the signal delayed by the first delay circuit 717, and a second delay circuit for timing adjustment 718 for delaying the signal latched into the register 719. Further, the timing adjustment circuit is provided, at its output portion, with clocked inverters 712 and 713 for complementarily selecting and outputting a signal outputted from the second delay circuit 718 or the clocked inverter 702 according to the control signal ALE.

Each of the timing-adjusting delay circuits 717 and 718 is configured as a circuit wherein, for example, a plurality of inverters are series-connected so as to have a delay time equivalent to the sum of respective gate delay times. Assigned to the delay inverter array are a suitable number of stages according to respective cases such as positions to place timing adjustment circuits, signal species to be inputted to the timing adjustment circuits. Incidentally, each of the delay registers 201, 202 and 203 shown in FIG. 2 can be made up of a circuit similar to FIG. 6.

In the timing adjustment circuits 124 and 125 shown in FIG. 6, since ALE is fixed low when AL=0, the clocked inverters 703 and 712 are disabled and the clocked inverters 702 and 713 are enabled according to the control signal ALE and a signal ALE obtained by inverting it by the inverter 701. Consequently, the state of latching of a node N701 by the latch LT12 is released so that a through path for directly connecting the inverters 702 and 713 is selected, whereby the input signal IN is outputted without being delayed practically. At this time, the clocked inverter 704 is enabled and the node N702 is brought into a fixed state by the latch LT11.

On the other hand, since the control signal ALE is fixed high when AL=1, the clocked inverters 702 and 713 are disabled and the clocked inverters 703 and 712 are enabled according to ALE and the signal obtained by inverting it by the inverter 701. Consequently, the state of latching of a node N702 by the latch LT11 is released so that a delay-side signal path including the timing-adjusting delay circuit 717 is selected. At this time, the clocked inverter 716 is enabled and the node N701 is brought into a fixed state by the latch LT12. When AL=1, the clock YCLK3 or YCLK4 is inputted from the command decoder 102, and the input signal IN is temporarily latched into the register 719. Therefore, the input signal IN is outputted with being delayed by one cycle of YCLK3 or YCLK4. Incidentally, each of the timing-adjusting delay circuits 717 and 718 is configured so as to be supplied with such a delay as to obtain most suitable timing signals according to respective conditions such as the position to place the timing adjustment circuit 124 or 125, signal species to be inputted thereto.

Figure 7:
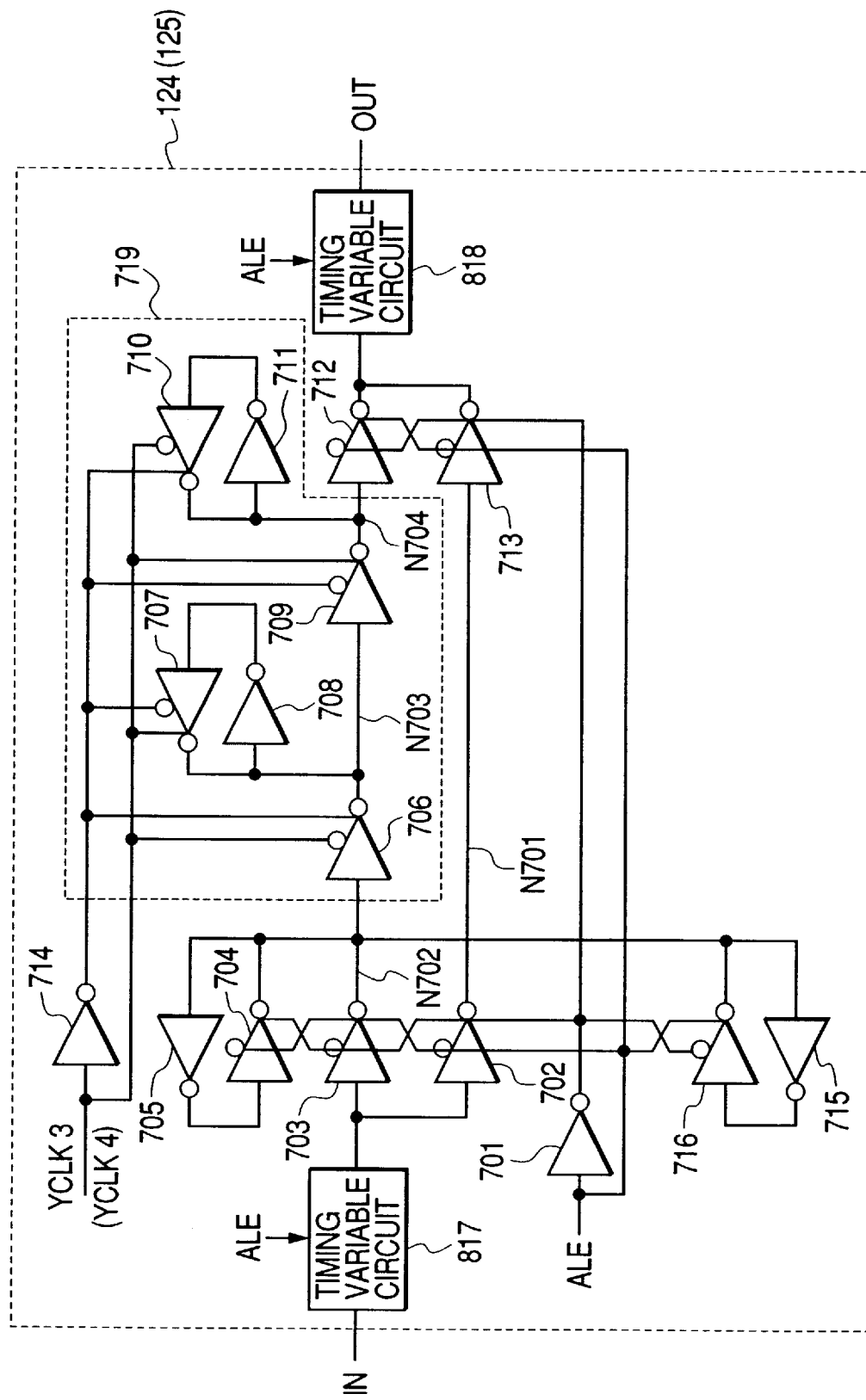
FIG. 7 is a circuit diagram depicting another configurational example of the timing adjustment circuit shown in FIG. 1.

FIG. 7 shows a second embodiment illustrative of a specific circuit of each of timing adjustment circuits 124 and 125. The timing adjustment circuits 124 and 125 according to the present embodiment are relatively similar to the timing adjustment circuits 124 and 125 shown in FIG. 6 in configuration. They are different from the timing adjustment circuits shown in FIG. 6 only in that timing variable circuits 817 and 818 each capable of adjusting a delay time are used in place of the timing-adjusting delay circuits 717 and 718 shown in FIG. 6, and the timing variable circuit 817 is provided in a stage preceding a clocked inverter 703 without being provided in a stage subsequent thereto and the timing variable circuit 818 is provided in a stage subsequent to a clocked inverter 712 without being provided in a stage prior to it.

The timing adjustment circuit is similar in basic operation to the circuit shown in FIG. 6. When AL=0, a through path for directly connecting inverters 702 and 713 is selected and an input signal IN is outputted without being delayed practically. When AL=1, the input signal IN is temporarily latched in a register 719 and thereby outputted with being delayed by one cycle of YCLK3 or YCLK4.

Figure 9:
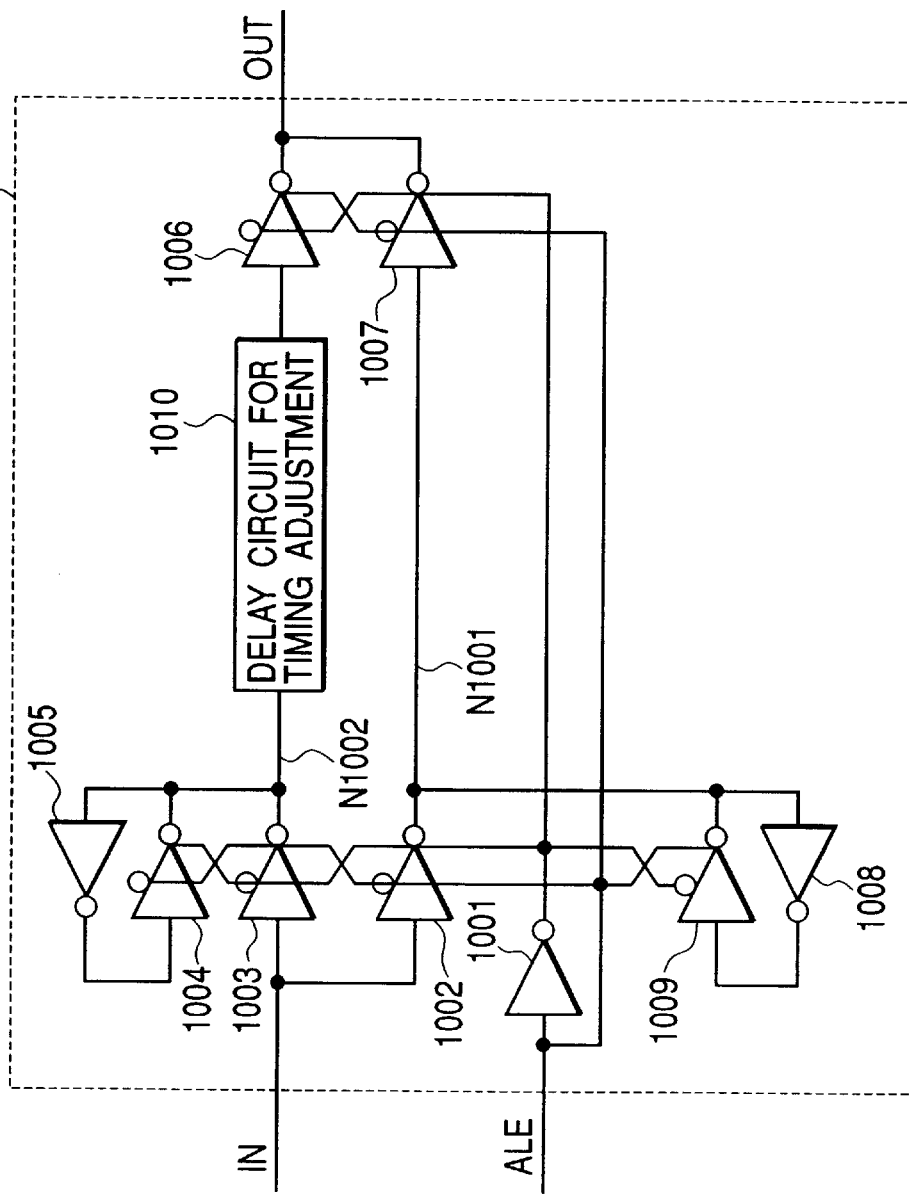
FIG. 9 is a circuit diagram depicting one configurational example of a timing variable circuit.

The timing variable circuits 817 and 818 are configured as shown in FIG. 9 by way of example. As is understood from the same drawing, each of the timing variable circuits 817 and 818 has a configuration of such a type that the register 719 employed in each of the timing adjustment circuits 124 and 125 shown in FIG. 6 and either one of the timing-adjusting delay circuits 717 and 718 employed therein are omitted. Thus, each of the timing variable circuits 817 and 818 serves so as to control timing for the input signal IN according to the state of a control signal ALE, i.e., the value of AL and perform its output.

Figure 8:
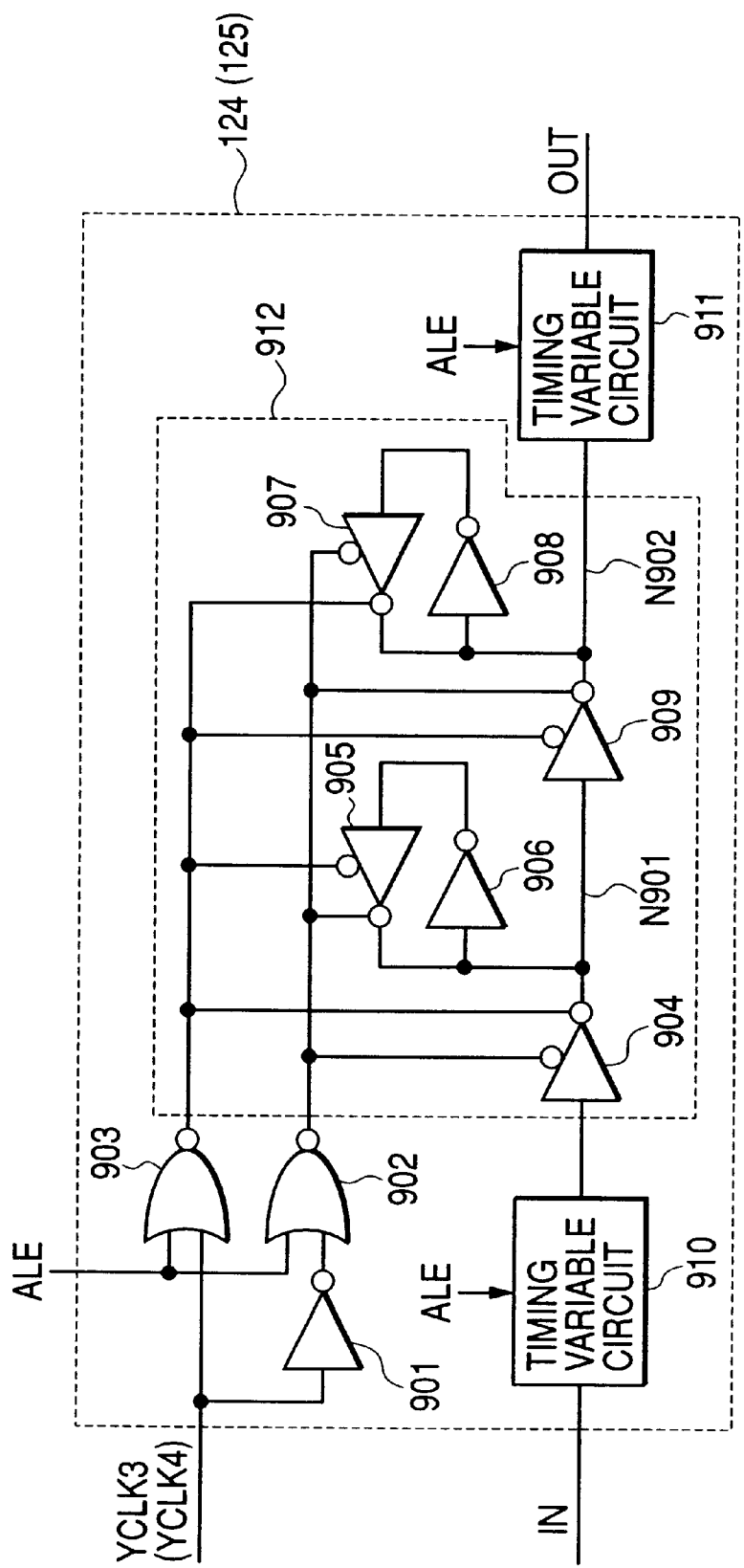
FIG. 8 is a circuit diagram showing a third configurational example of the timing adjustment circuit shown in FIG. 1.

FIG. 8 shows a third embodiment illustrative of a specific circuit of each of timing adjustment circuits 124 and 125.

The timing adjustment circuit 124 (125) according to the present embodiment comprises NOR gates 902 and 903 either one of which selects either a clock YCLK3 (YCLK4) or a signal obtained by inverting it by an inverter 901 in response to a control signal ALE, a first timing variable circuit 910 for delaying an input signal IN, a register 912 comprised of master slave-configured flip-flops, which latches the output of the timing variable circuit 910, and a second timing variable circuit 911 for delaying the output of the register 912. Each of the timing variable circuits 910 and 911 can be configured as a circuit having the same configuration as the circuit shown in FIG. 9, which corresponds to one employed in the embodiment shown in FIG. 7. Each of the timing variable circuits 910 and 911 provides a delay time controlled according to the value of AL.

In the timing adjustment circuit 124 (125) according to the present embodiment, since ALE is fixed low when AL=0, the outputs of a NOR902 and a NOR903 are fixed high. Thus, clocked inverters 905 and 907 are disabled and clocked inverters 904 and 909 are enabled. Consequently, a node N901 and a node N902 are released from latching so that a through path is selected, whereby the input signal IN is outputted without being delayed practically. On the other hand, since ALE is fixed high when AL=1, the outputs of the NOR902 and NOR903 are changed according to YCLK3 and an inverted signal of ALE generated by the inverter 901. Since the YCLK3 (YCLK4) is inputted from the command decoder 102, the input signal IN is outputted with being delayed by one cycle by the register 912.

Figure 10:
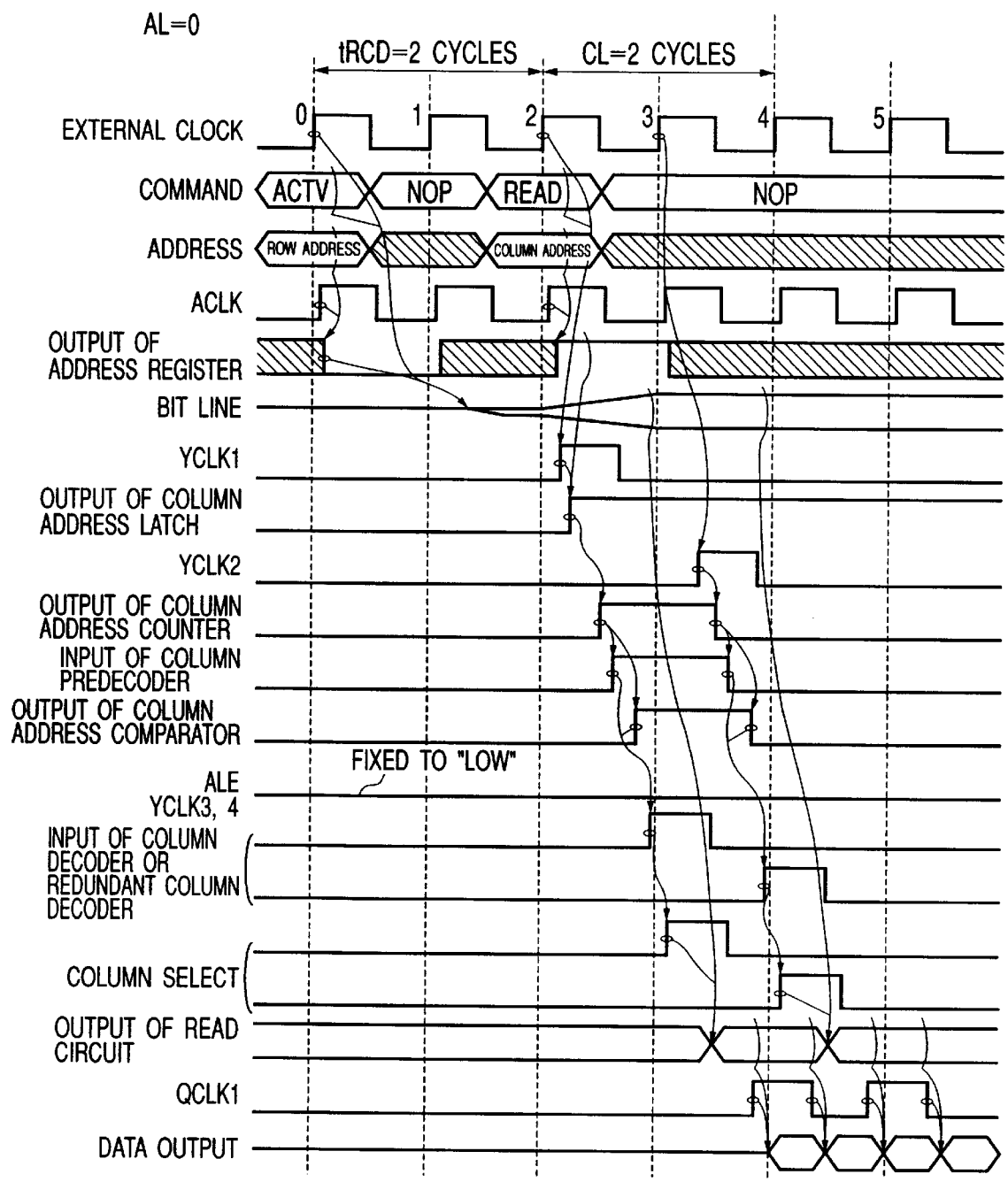
FIG. 10 is a timing chart for describing internal major signals at a read operation of the double data rate synchronous DRAM according to the embodiment shown in FIG. 1 where tRCD is 2 cycles, a CAS latency is 2 cycles, and a column command advanced latency (AL) is 0 cycle.
Figure 11:
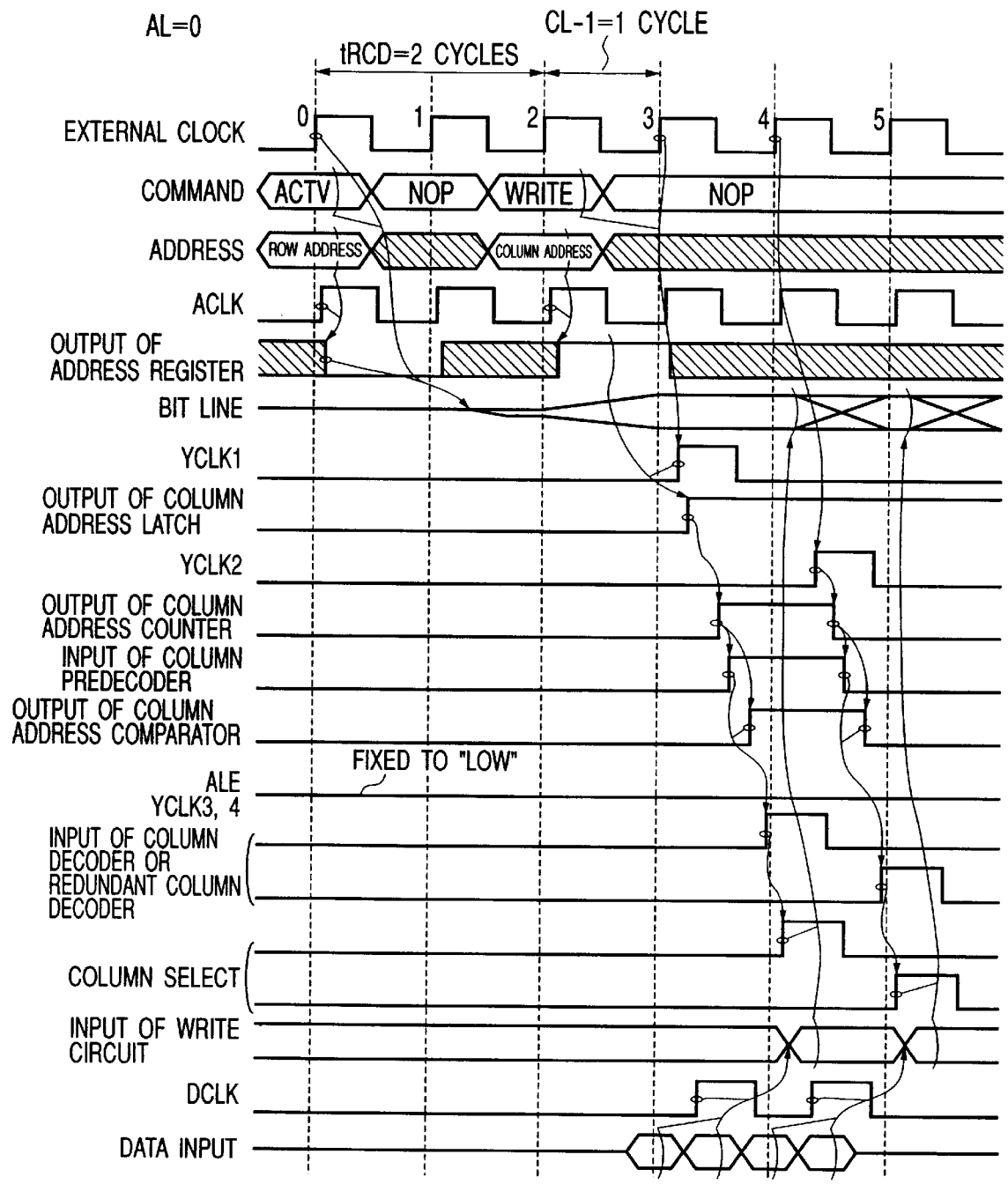
FIG. 11 is a timing chart for describing internal major signals at a write operation of the double data rate synchronous DRAM according to the embodiment under the same conditions as shown in FIG. 10.
Figure 12:
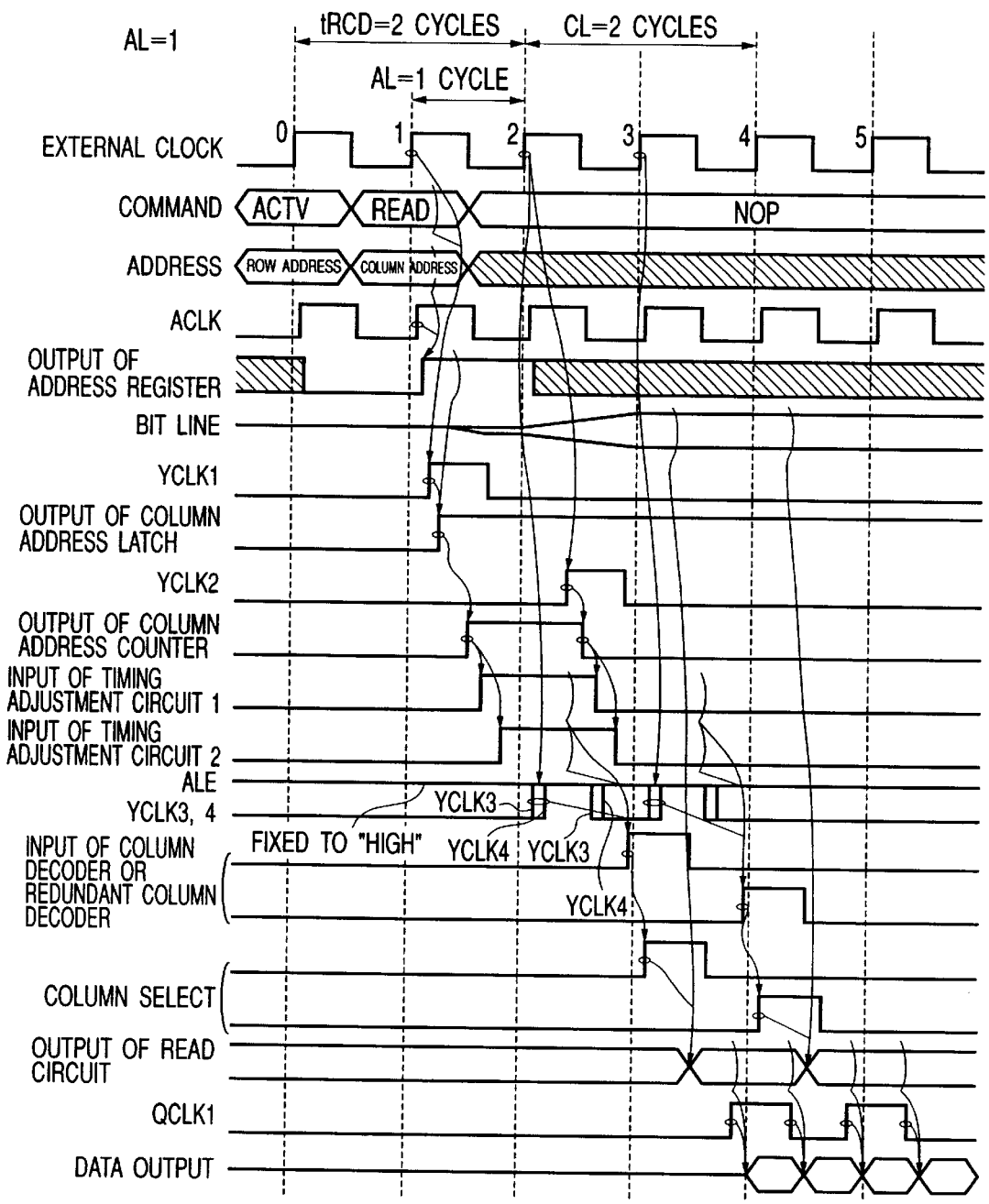
FIG. 12 is a timing chart for describing internal major signals at a read operation of the double data rate synchronous DRAM according to the embodiment shown in FIG. 1 where tRCD is 2 cycles, a CAS latency is 2 cycles and a column command advanced latency (AL) is 1 cycle.
Figure 13:
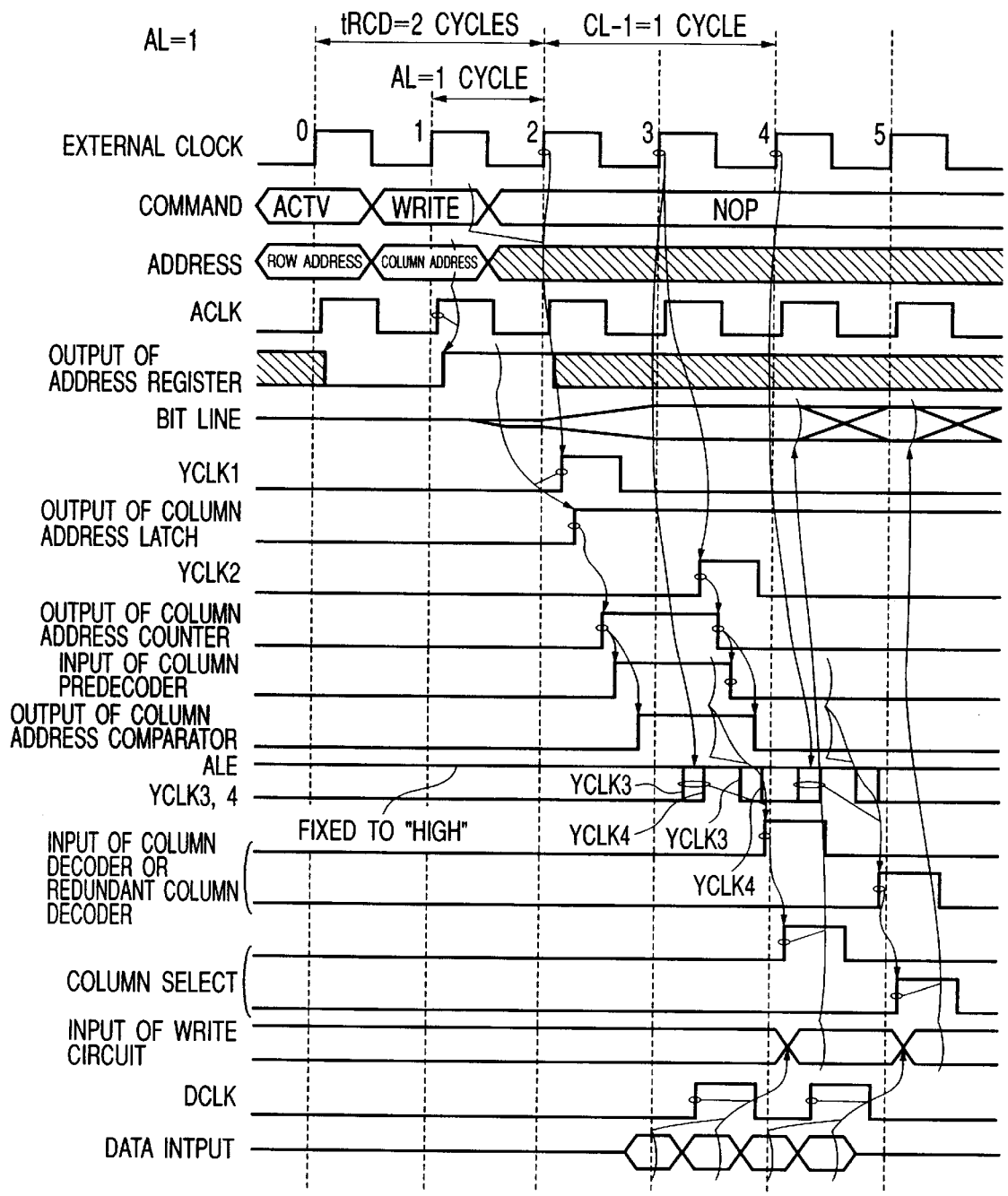
FIG. 13 is a timing chart for describing internal major signals at a write operation of the double data rate synchronous DRAM according to the embodiment under the same conditions as shown in FIG. 12.

The operation of the DRAM shown in FIG. 1 will next be explained. FIGS. 10 through 13 are shown on the assumption that the time tRCD required between the input of an ACTV command and the input of a column command is given as 2 cycles, and a CAS latency is given as 2 cycles, wherein FIG. 10 is a timing chart for describing a read operation of the DRAM at the time that a column command advanced latency AL is 0, i.e., the column command is inputted after the elapse of 2 cycles since the input of the ACTV command, FIG. 11 is a timing chart for describing a write operation thereof at the time that AL is 0, FIG. 12 is a timing chart for describing a read operation thereof at the time that AL is 1, i.e., the column command is inputted after the elapse of one cycle since the input of the ACTV command, and FIG. 13 is a timing chart for describing a write operation thereof at the time that AL is 1.

A read operation at AL=0 will first be explained with reference to FIG. 10. A row address is taken in from the address buffer 101 simultaneously with the time when an ACTV command is inputted. In response to the ACTV command, the row address is latched into the address register 103 according to ACLK outputted from the command decoder 102. Further, the row address is latched into the row address latch 104 according to a clock RCLK outputted from the command decoder 102 in response to the ACTV command. Afterwards, a row address signal from the row address latch 104 is inputted to the row address comparator 105 where it is compared with a relief address stored in the row relief address storage circuit 106 and the coincidence or non-coincidence of the two is judged. If they are found to coincide with each other, then the row predecoder 107 is deactivated and hence a redundant word line is selected by the redundant row decoder 108. If they are found not to coincide with each other, then the row predecoder 107 is activated so that the output of the row address latch 104 is predecoded by the row predecoder 107. Further, the output of the row predecoder 107 is decoded by the row decoder 109 to select the corresponding word line. Afterwards, data is outputted from a memory cell connected to the selected word line to at least one bit line. When the potentials on the bit line pair are fully set up, a sense amplifier amplifies the difference between the potentials on the started-up or activated bit lines.

Since AL=0 in FIG. 10, a READ command is inputted after the elapse of two cycles since the input of the ACTV command. Simultaneously with it, a column address is taken in from the address buffer 101. In response to the READ command, the column address is latched into the address register 103 according to the clock ACLK outputted from the command decoder 102. Further, the column address is latched into the column address latch 110 according to a clock YCLK1 outputted from the command decoder 102 in response to the READ command. Since a write register enable signal WRE generated by the command decoder 102 in response to the READ command is fixed low herein, the column address is outputted from the column address latch 110 without being delayed one cycle.

Thereafter, the column address passes through the column address counter 111 and is inputted to the column address comparator 112 where it is compared with a relief address stored in the column relief address storage circuit 113 and hence the coincidence or non-coincidence of the two is determined. While the output produced from the comparator 112 is inputted to the second timing adjustment circuit 125, ALE is fixed low when AL=0. Therefore, the output passes through the second timing adjustment circuit 125. Since ALE is fixed low even in the case of the first timing adjustment circuit 124, the output produced from the column address counter 111 passes therethrough and is inputted to the column predecoder 114. When they are found to coincide with each other as a result of comparison by the comparator 112, the column predecoder 114 is deactivated according to the output of the second timing adjustment circuit 125, so that a redundant bit line pair is selected by the redundant column decoder 115. When they are found not to coincide with each other, the column predecoder 114 is activated according to the output of the second timing adjustment circuit 125, so that the output of the first timing adjustment circuit 124 is predecoded by the column predecoder 114. Thereafter, the resultant output is decoded by the column decoder 116 to select the corresponding bit lines.

At this time, a bit-line selecting condition is that the potential on each bit line has fully been amplified. Owing to the selection of the corresponding bit line pair, data on the bit line pair is inputted to the read circuit 117. Afterwards, the read data is further amplified by the read circuit 117, followed by delivery to the output register 118. The output register 118 sends the data to the output buffer 120 according to a CAS latency information signal CL outputted from the command decoder 102 and a QCLK1 outputted from the output clock generator 119. In the double data rate synchronous DRAM according to the present embodiment at this time, 2n-bit data are sent to the output buffer 120. Further, n-bit data corresponding to half thereof is outputted on the rising edge of the clock QCLK1, and the remaining n-bit data is outputted on the falling edge of the clock QCLK1.

Incidentally, a read circuit enable signal MAE and an output clock generator enable signal ORE are outputted from the command decoder 102 in response to the READ command upon the read operation. They pass through the delay register 201 and the delay register 202 lying within the delay control circuit 126 shown in FIG. 2 and are respectively supplied to the read circuit 117 and the output clock generator 119 as MAE1 and ORE1. Since ALE is fixed low because of AL 0 herein, MAE and ORE pass through the delay register 201 and the delay register 202 and are outputted from the delay control circuit 126 as MAE1 and ORE1 without being delayed.

A write operation at AL=0 is represented as shown in FIG. 11: A row address is taken in simultaneously with the input or entry of an ACTV command. In a manner similar to the reading, the row address is decoded to select the corresponding word line, and data stored in a memory cell is outputted to its corresponding bit line pair. When the potential on each bit line is fully set up, a sense amplifier is started up to amplify the potential on each bit line.

Since AL=0 here, a WRITE command is inputted after the elapse of two cycles since the input of the ACTV command. Simultaneously with its input, a column address is taken in. Since a write register enable signal WRE generated by the command decoder 102 is brought to an enable state (high level) in response to the WRITE command, the column address latch 110 outputs the column address according to a clock YCLK1 generated by the command decoder 102 with being delayed by one cycle from the input of the WRITE command. Afterwards, the column address is decoded simultaneously with the reading to select the corresponding bit line pair. Since AL=0 at this time, the signal inputted to each of the first timing adjustment circuit 124 and the second timing adjustment circuit 125 is caused to pass therethrough. Write data is captured from outside in one cycle (=AL+CAS latency 1) since the entry of the WRITE command.

In the double data rate synchronous DRAM according to the present embodiment, the write data is taken in by the input buffer 121. The first n-bit data is latched into the input register 122 on the rising edge of a clock DCLK outputted from the command decoder 102 in response to the WRITE command, and the next n-bit data is latched therein on the falling edge of the clock DCLK, respectively. They are set as 2n-bit data. The captured write data is transmitted to the memory cell array 123 through the write circuit 117. Further, the write data is written into the corresponding memory cell through the selected bit line pair.

Incidentally, a write circuit enable signal WBE is outputted from the command decoder 102 in response to the WRITE command upon the write operation. The write circuit enable signal WBE passes through the delay register 203 lying within the delay control circuit 126 shown in FIG. 2 and is inputted to the write circuit 117 as WBE1. Since, at this time, ALE is fixed low when AL=0, WBE passes through the delay register 203 and is outputted from the delay control circuit 126 as WBE1.

A read operation at the time that a READ command is inputted after the elapse of one cycle since AL=1, i.e., the entry of the ACTV command, will next be explained. As shown in FIG. 12, a row address is taken in simultaneously with the input of the ACTV command and then decoded in the same manner as when AL=0, so that the corresponding word line is selected. Thus, data stored in a memory cell is outputted to its corresponding bit line pair. When the bit lines are fully set up, a sense amplifier is started up to amplify the difference in potential between the bit line pair.

When the READ command is inputted after the elapse of one cycle since the input of the ACTV command, a column address is taken in from the address buffer 101 simultaneously with it. In response to the READ command, the column address is latched into the address register 103 according to a clock ACLK outputted from the command decoder 102. Further, the column address is latched into the column address latch 110 according to a clock YCLK1 outputted from the command decoder 102 in response to the READ command. Since a write register enable signal WRE generated by the command decoder 102 in response to the READ command is fixed low upon reading, the column address is outputted from the column address latch 110 without being delayed by one cycle.

Thereafter, the column address passes through the column address counter 111 and is inputted to the column address comparator 112, where it is compared with a relief address stored in the column relief address storage circuit 113 and thereby the coincidence or non-coincidence of the two is determined. Since ALE is now fixed to a high level when AL=1, the output from the comparator 112 is latched into the second timing adjustment circuit 125, and the output from the column address counter 111 is latched into the first timing adjustment circuit 124.

Further, the command decoder 102 generates clocks YCLK3 and YCLK4 in response to a clock subsequent to the elapse of one cycle since the input of the READ command. They are inputted to the first timing adjustment circuit 124 and the second timing adjustment circuit 125 respectively. Therefore, the output of the column address counter 111, which has been latched into the first timing adjustment circuit 124, and the output of the comparator 112, which has been latched into the second timing adjustment circuit 125, are respectively outputted in response to the rising edges of the YCLK3 and YCLK4. Thus, the output of the column address counter 111 and the output of the comparator 112 are respectively delayed one cycle.

Thereafter, when they are found to coincide with each other as a result of the comparison by the comparator 112, the column predecoder 114 is deactivated according to the output of the second timing adjustment circuit 125 so that a redundant bit line is selected by the redundant column decoder 115. On the other hand, when they are found not to coincide with each other, the column predecoder 114 is activated according to the output of the timing adjustment circuit 125, and hence the output of the first timing adjustment circuit 124 is predecoded by the column predecoder 114. Further, the output of the column predecoder 114 is decoded by the column decoder 116 to select the corresponding bit line pair. Since, at this time, a delay corresponding to one cycle is already included in a column address path, a bit-line potential is fully amplified and hence correct data can be read out. Owing to the selection of the bit line pair, data on the bit line is thereafter inputted to the read circuit 117 where the data is further amplified, followed by delivery to the output register 118.

In response to a CAS latency information signal CL sent from the command decoder 102 and a clock QCLK1 generated by the output clock generator 119, the output register 118 sends the data to the output buffer 120 from which the data is outputted to the outside. In the double data rate synchronous DRAM at this time, the data is outputted with both timings at the rising and falling edges of the clock in the same manner as described in FIG. 11.

Incidentally, a read circuit enable signal MAE and an output clock generator enable signal ORE are outputted from the command decoder 102 in response to the READ command upon reading. They pass through the delay registers 201 and 202 lying within the delay control circuit 126 shown in FIG. 2 and are respectively inputted to the read circuit 117 and the output clock generator 119 as MAE1 and ORE1. Since, however, ALE is fixed to a high level when AL=1, MAE and ORE are respectively delayed one cycle within the delay registers 201 and 202 and outputted as MAE1 and ORE1.

A write operation at AL=1 is represented as shown in FIG. 13: An ACTV command is first inputted and a row address is taken in simultaneously with the input of the ACTV command. In a manner similar to the reading, the row address is decoded to select the corresponding word line, and data stored in a memory cell is outputted to its corresponding bit line pair. When the difference in potential between the bit line pair is set up to some degree, a sense amplifier is started up to amplify the difference in potential between the bit line pair.

When a WRITE command is inputted after the elapse of one cycle since the input of the ACTV command, a column address is taken in simultaneously with its command input. Next, a write register enable signal WRE generated by the command decoder 102 is enabled in response to the WRITE command. Thus, the column address latch 110 outputs the column address according to a clock BCLK generated by the command decoder 102 with being delayed by one cycle. Afterwards, the column address is decoded simultaneously with the reading to select the corresponding bit line pair. Since ALE is fixed to a high level by AL=1 at this time, the signals inputted to the first timing adjustment circuit 124 and the second timing adjustment circuit 125 are respectively delayed one cycle by the first and second timing adjustment circuits 124 and 125 and thereafter outputted therefrom.

Thus, as compared with AL=0, the delay time between the input of the WRITE command and the selection of each bit line is delayed once cycle. As a result, write data can be captured from outside in two cycles (=AL+CAS latency 1) since the input of the WRITE command. In the double data rate synchronous DRAM at this time, data is captured on both the rising and falling edges of the clock. The write data is taken in by the input buffer 121 and latched into the input register 122 according to a clock DCLK outputted from the command decoder 102 in response to a clock subsequent to the elapse of one cycle from the input of the WRITE command.

However, even if the WRITE command is inputted in the cycle subsequent to the input of the ACTV command when AL=1 as described above, the delay time up to the generation of the clock DCLK is delayed one cycle with respect to AL=0. Therefore, the write data can be captured without any problem. Thereafter, the write data is sent to the memory cell array 123 through the write circuit 117 and further written into its corresponding memory cell through the selected bit line. A write circuit enable signal WBE is outputted from the command decoder 102 in response to the WRITE command and passes through the delay register 203 lying within the delay control circuit 126 shown in FIG. 2, followed by input to the write circuit 117 as WBE1. Since, however, ALE is fixed to a high level when AL=1, WBE is delayed one cycle within the delay register 203 and thereafter outputted as WBE1. Therefore, even if the entry of the WRITE command is made fast by one cycle, the writing of data into the corresponding memory cell can be carried out.

Figure 14A:
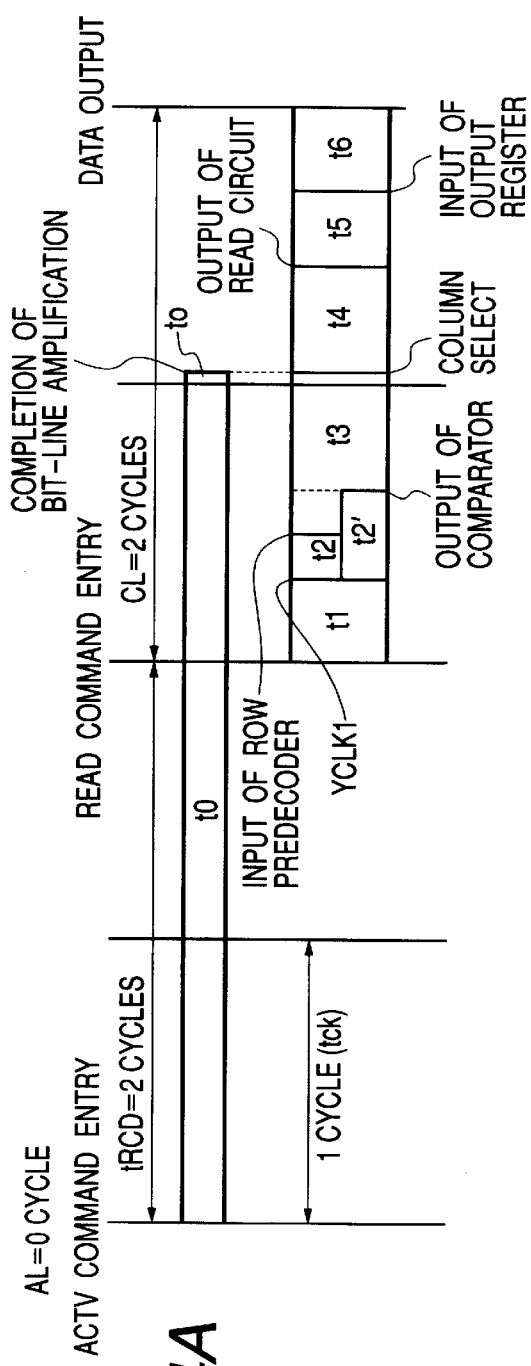
FIGS. 14A and 14B are respectively timing charts showing the sequence of operations of principal circuits at a read operation of the double data rate synchronous DRAM according to the embodiment shown in FIG. 1 where tRCD is 2 cycles, a CAS latency is 2 cycles, and a column command advanced latency (AL) is 0 cycle (FIG. 14A) and 1 cycle (FIG. 14B)
Figure 14B:
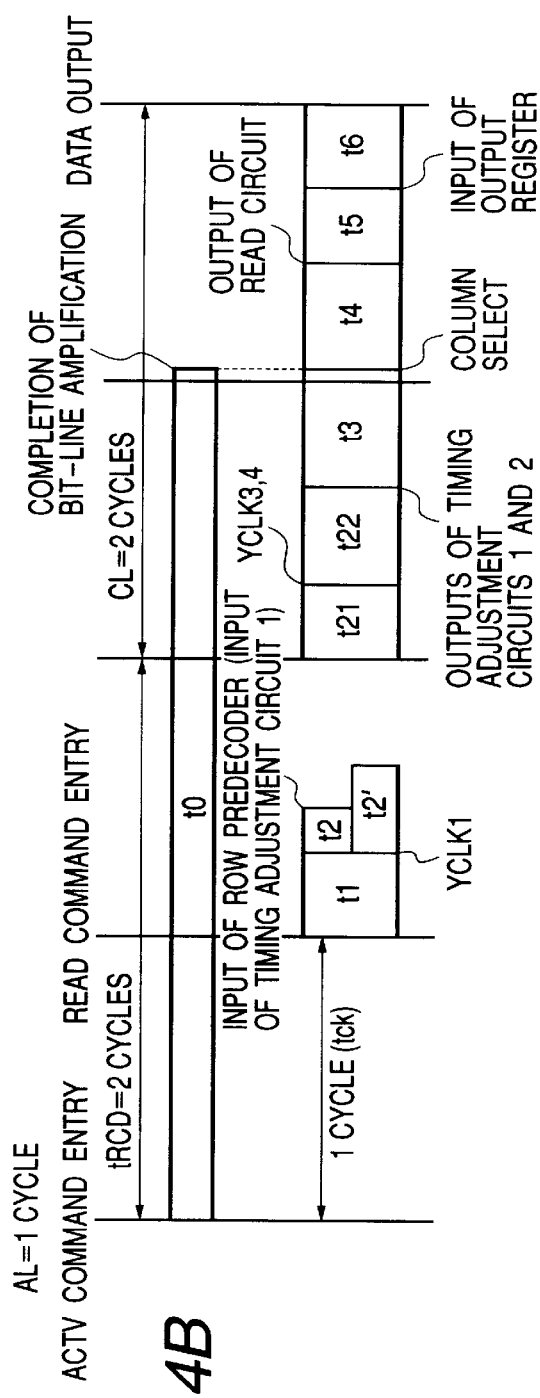

FIG. 14A shows timings provided for row and column signals at a read operation where a column command advanced latency is 0. In FIGS. 14A and 14B, the time required to sufficiently amplify a potential on a bit line from the entry of an ACTV command is defined as t0, the time necessary to cause the column address latch 110 to take in or capture a column address according to YCLK1 from the entry of a READ command is defined as t1, the time required between the latching of the column address and the input thereof to the column predecoder 114 is defined as t2, the time required to output the result of comparison from the comparator 112 after the latching of the column address is defined as t2', the time required between the output of the comparator 112 and the selection of each bit line subsequent to the decoding of addresses by the decoders 115 and 116 is defined as t3, the time required between the selection of the bit line and the output of a signal amplified by the read circuit 117 is defined as t4, the time required between the output of data from the read circuit 117 and the input thereof to the output register 118 is defined as t4, and the time required between the input of the data to the output register 118 and the output of the data from the output buffer 120 is defined as t6, respectively. When 3 cycles are required until the potential on the corresponding bit line is sufficiently amplified since the entry of the ACTV command, the bit-line amplification completion time (t0) and a bit-line selection time (2tck +t1+t2'+t3) are identical as is understood from the same drawing where the READ command is inputted after two cycles since the entry of the ACTV command.

On the other hand, FIG. 14B shows timings for a read operation when AL=1. In this case, a READ command is inputted after one cycle since the entry of an ACTV command. The generation of YCLK3 and YCLK4 is started after one cycle from its input. After the elapse of a time t21, YCLK3 and YCLK4 are outputted. After the elapse of a time t22, column address data and the output of comparator 112 are latched into the timing adjustment circuits 124 and 125. Further, the corresponding bit line pair is selected after the elapse of a time t3. If, at this time, the time (t21+t22) required to generate YCLK3 and YCLK4 and complete the latching of the timing adjustment circuits 124 and 125 is made identical to the time (t1+t2') required to latch a column address and output the result of comparison from the comparator 112 since the entry of the READ command at AL=0, i.e., (t21 +t22=(t1+t2'), the times required to select the bit lines since the entry of the ACTV commands can be made substantially identical even when AL=0 and AL=1. It is therefore possible to correctly read data stored in a selected memory cell.

Figure 15A:
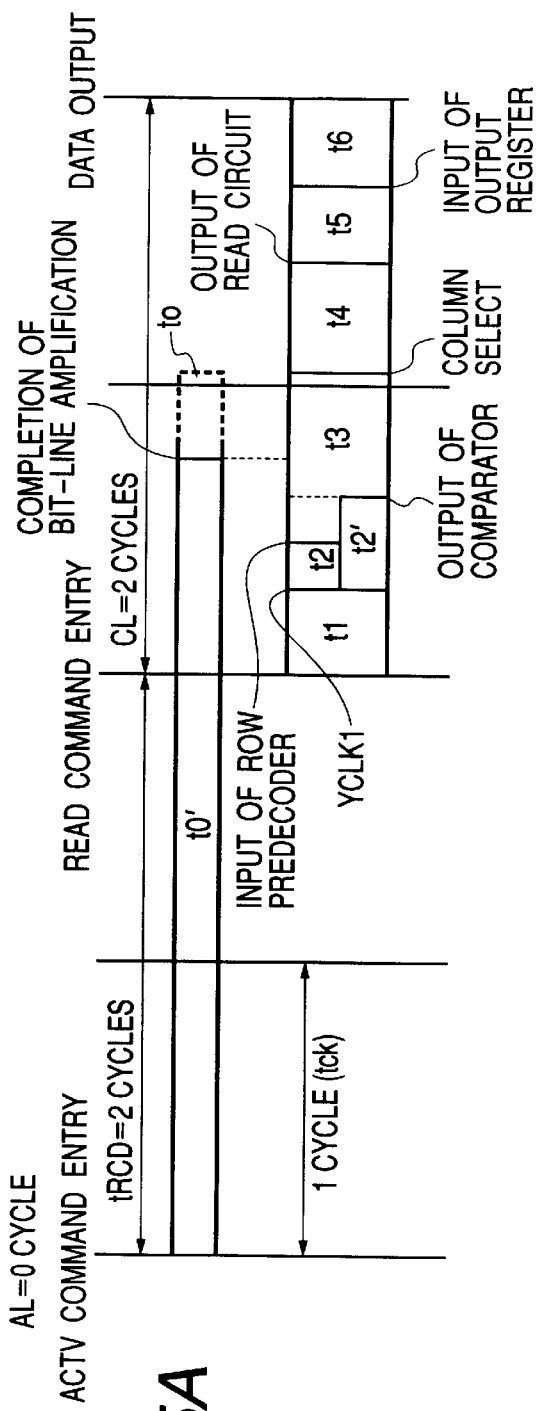
FIGS. 15A and 15B are respectively timing charts showing the sequence of operations of the principal circuits at a read operation where a column command advanced latency (AL) is 0 cycle (FIG. 15A) and 1 cycle (FIG. 15B) when the time required between the input or entry of an ACTV command and the amplification of a potential on each bit line is short.

FIG. 15A shows row and column timings at a read operation at AL=0 where the time required until the completion of bit-line amplification is relatively short. In the timing of FIG. 15A, the time t0' required to sufficiently amplify each bit line since the entry of an ACTV command is shorter than the time (2tck+t1+t2'+t3) required to select the bit line since the entry of the ACTV command. In such a case, a cycle time is determined in such a manner that the time (t1+t2+t3+t4+t5+t6) required to output data after the entry of a READ command is completed within 2 cycles (2tck). Namely, the cycle time (tck) is rate-determined by a column path. The optimum timing is given where a bit-line amplification completion point (read end of t0') and a column decode completion point (rear end of t3) coincide with each other. It is however understood that since the completion of the bit-line amplification is finished precedently, a time indicated by a broken line t0 is wasted. Incidentally, the phenomenon that the time required up to the completion of the bit-line amplification becomes relatively short, occurs between products due to process variations.

Figure 15B:
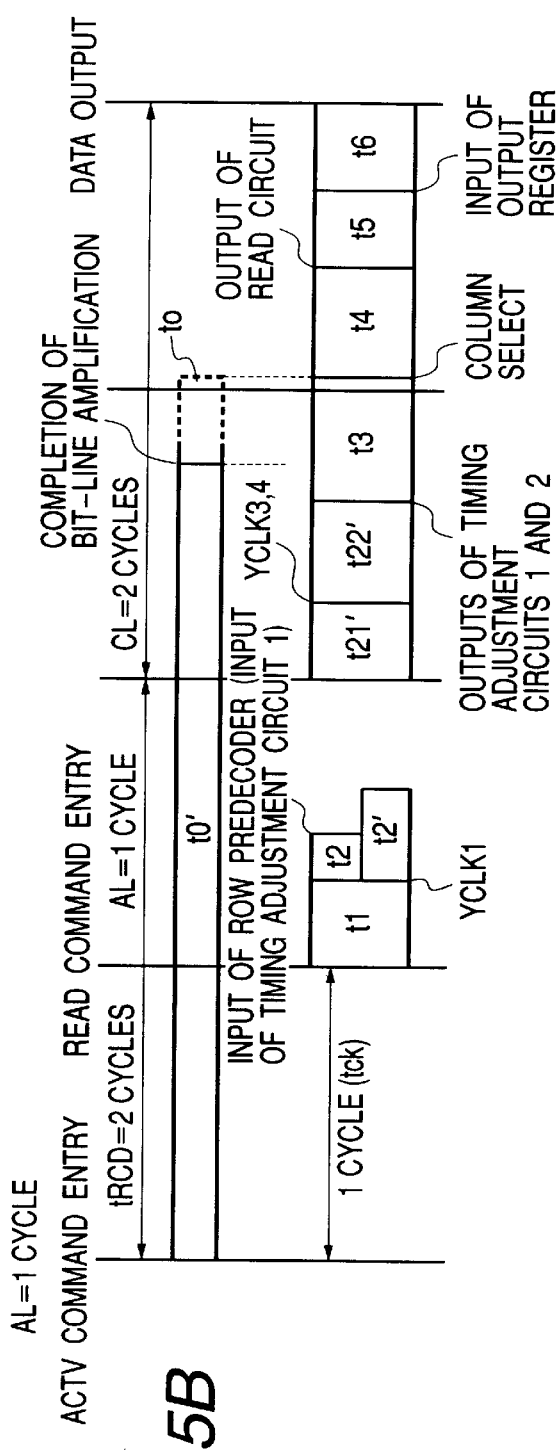

As to the products in which the time required to complete the bit-line amplification becomes relatively short as described above, a register capable of delaying a column address is inserted in a stage preceding the column predecoder 113 as in the embodiment to thereby realize AL=1 at which the READ command is inputted in a one-cycle advanced state. Consequently, as shown in FIG. 15B, the latch (t1 period) of a column address and the comparison (t2') of the comparator 12 can be carried out in a second cycle, and the generation of YCLK3 and 4 to the decoding of the column address can be performed in a third cycle. In FIG. 15B, t21' indicates the time required to generate YCLK 3 and 4 from a clock, and t22' indicates the time required to determine the output of an address delayed by each of the timing adjustment circuits 124 and 125. To make (t21'+t22') shorter than (t1+t2) is a necessary condition. However, this can easily be realized on a circuitry basis.

As a result, since the bit line can be selected in accordance with the time required to amplify the bit line when AL=1, the cycle time can be shortened by (t0−t0)/4 obtained by dividing a time difference up to the completion of the bit-line amplification by "4" of the total required cycle. Since the time (t21'+t22'+t3+t4+t5+t6) required between the generation of YCLK3 and 4 and the output of data may be completed in two cycles according to such timing control as shown in FIG. 14B, a cycle time Tck is determined by either short one of (t1+t2') and (t21'+t22'+t3+t4+t5+t6)/2 in principle if the required time up to the completion of bit-line amplification becomes shorter. As compared with the time when AL=0, the cycle time can be shortened by {(t1+t2'+ t3+t4+t5+t6)/2−(t1+t2)} or {(t1+t2'+t3+t4+t5+t6)/2−(t21'+ t22'+t3+t4+t5 +t6)/2}.

How to set the column command advanced latency AL in the double data rate synchronous DRAM configured in FIG. 1 and the operation thereof at the time that AL is set, will next be explained.

In the embodiment shown in FIG. 1, a CAS latency CL is set to the CL setting register 131 according to a mode register set (MRS) command. According to an extended mode register set (EMRS) command, a column command advanced latency AL is set to the AL setting register 132 lying within the command decoder.

FIG. 16 shows specific examples of the MRS and EMRS commands. In the present embodiment, the MRS command is issued when a control signal CKE supplied from an external device such as a CPU or the like is high in level, /CS, /RAS, /CAS and /WE are low in level, and bank addresses BA1 and BA0 (or addresses A14 and A13) and a predetermined bit AP (e.g., A10) for an address are low in level. Further, various values are set according to the values of addresses A8 through A0. When CKE•BA0 (A14) is high in level and /CS, /RAS, /WE, BA1 (A13) and AP (A10) are low in level, the EMRS command is issued and various values are set according to the values of addresses.

When CKE, /RAS and /WE are high in level, and /CS, /CAS and AP (AP10) are low in level, a READ command for providing instructions for reading is issued, when CKE and /RAS are high in level and /CS, /CAS, /WE and AP (AP10) are low in level, a WRITE command for providing instructions for writing is issued, and when CKE, /CAS and /WE are high in level and /CS and /RAS are low in level, an ACTV command for providing instructions for the commencement of operation, i.e., the capture of a row address and the activation of each bank (memory array) is issued, respectively.

FIG. 17A shows one example of the relationship between addresses and set values at the setting of a CAS latency, based on an MRS command. In the DRAM according to the present embodiment, as shown in the same drawing, a burst length (BL) is set by addresses A0 through A2, and a burst type (interleave or sequential) is set by an address A3. Further, the CAS latency is set by addresses A4 through A6 and the reset of the output clock generator 119 is set up by an address A8. As to the CAS latency, for example, the latency is set to "2" when (A4, A5, A6) =(0, 1, 0), and the latency is set to "3" when (A4, A5, A6)=(1, 1, 0).

FIG. 17B shows one example of the relationship between addresses and set values at the setting of a column command advanced latency, based on an EMRS command. In the DRAM according to the present embodiment, as shown in the same drawing, the activation/non-activation of the output clock generator 119 is set by an address A0, and the column command advanced latency AL is set by addresses A1 through A3. As to the column command advanced latency AL, for example, the latency is set to "0" when (A1, A2, A3)=(0, 0, 0), the latency is set to "1" when (A1, A2, A3)=(1, 0, 0), and the latency is set to "2" when (A1, A2, A3)=(0, 1, 0).

Figure 18:
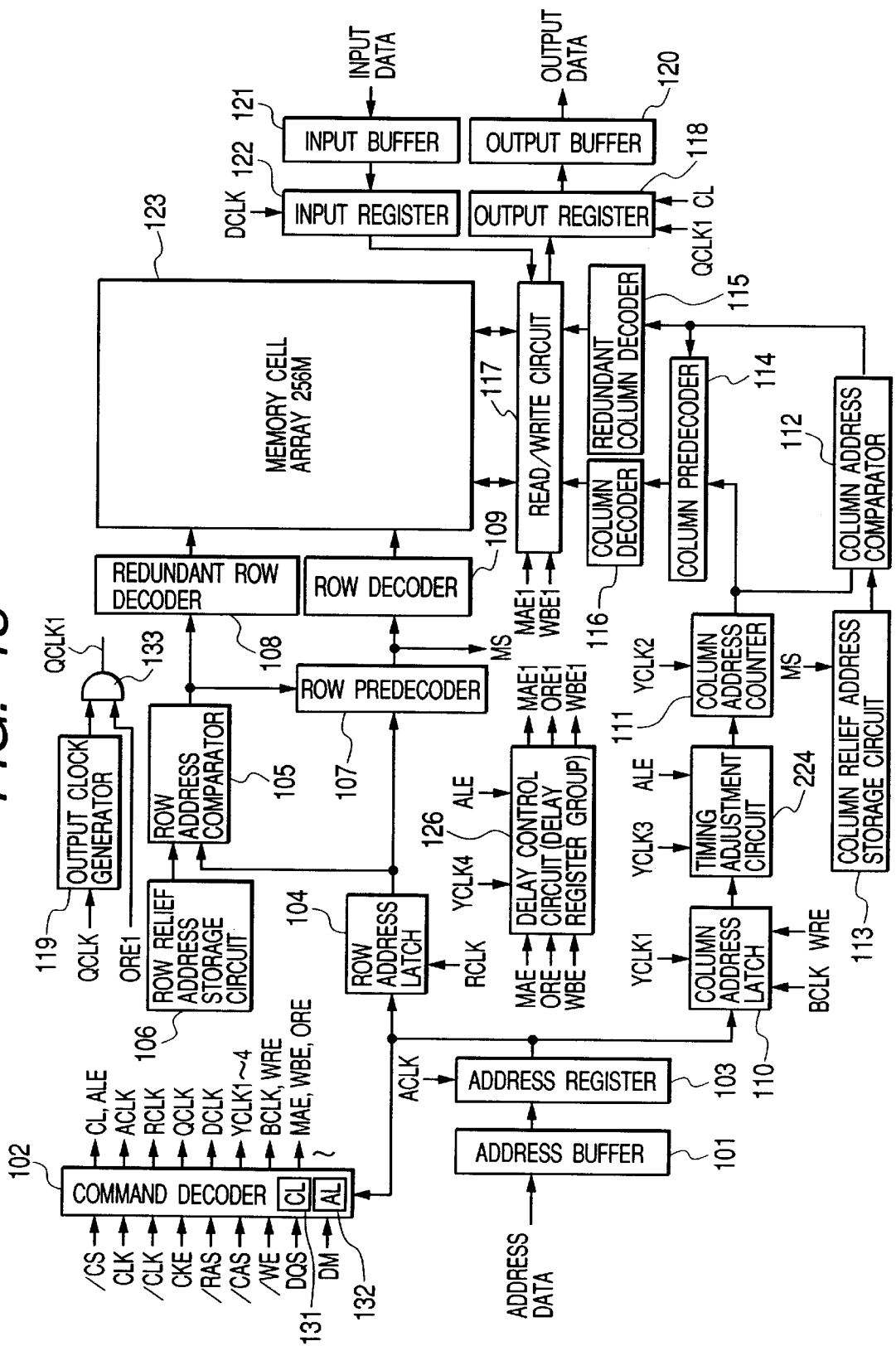
FIG. 18 is a block configurational diagram showing a second embodiment of a double data rate synchronous DRAM to which the present invention is applied.

FIG. 18 shows a second embodiment of a double data rate synchronous DRAM to which the present invention is applied. The second embodiment is one wherein in the first embodiment (FIG. 1), the timing adjustment circuits 124 and 125 provided in the stage preceding the column predecoder 114 are provided as 224 between the column address latch 110 and the column address counter 111. Since the second embodiment is similar in other configurations to the first embodiment, the same circuit blocks are respectively identified by the same reference numerals and the description of certain common ones will therefore be omitted.

Figure 19:
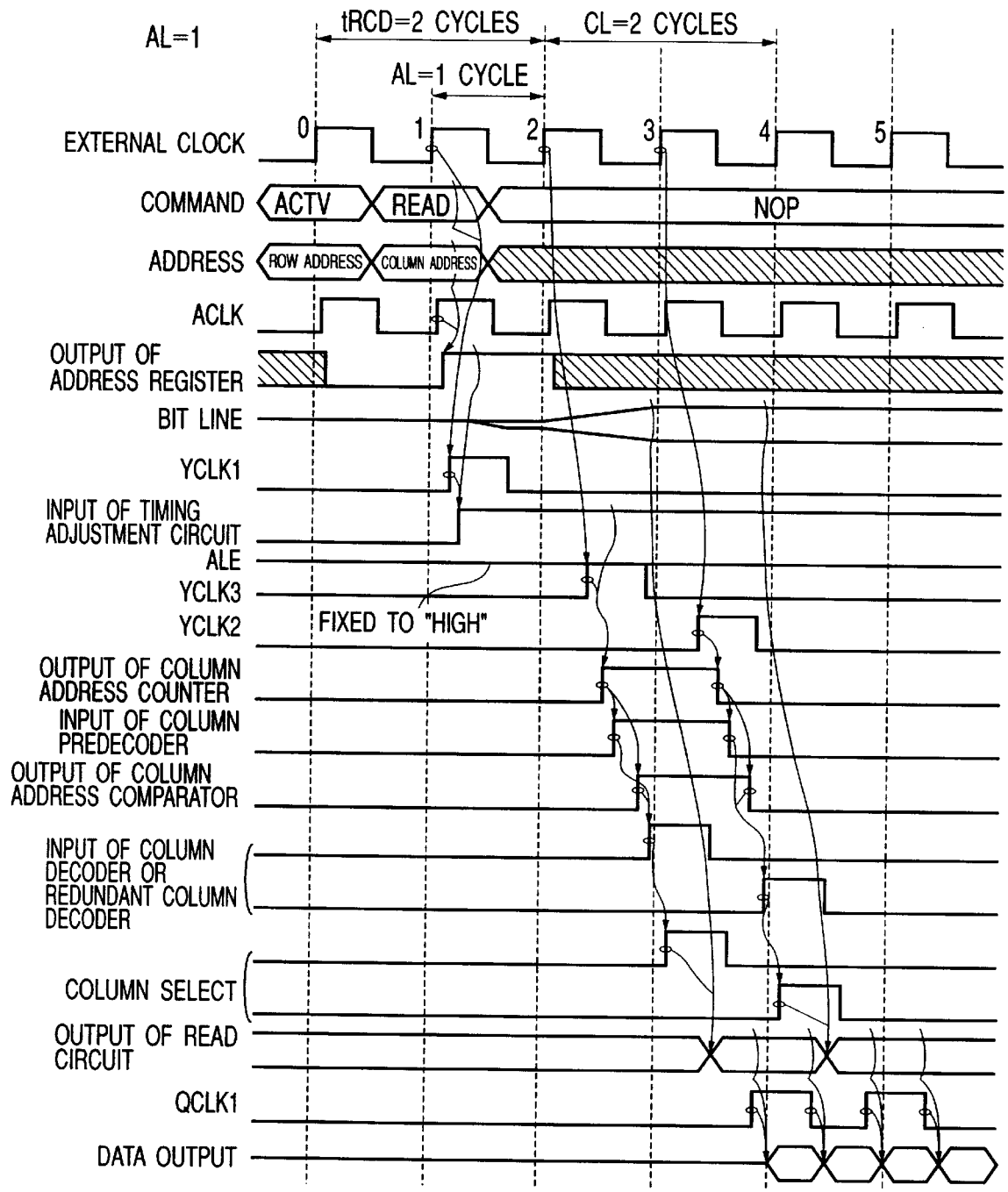
FIG. 19 is a timing chart for describing internal major signals at a read operation of the double data rate synchronous DRAM shown in FIG. 18 where tRCD is 2 cycles, a CAS latency is 2 cycles, and a column command advanced latency (AL) is 1 cycle.

FIG. 19 shows a timing chart for describing a read operation when an AL latency is 1 on the assumption that tRCD is 2 cycles and a CAS latency is 2 cycles. FIG. 19 corresponds to FIG. 12 showing the timing chart employed in the first embodiment.

As is apparent from the comparison with FIG. 12, the timing adjustment circuit 224 is provided in a stage preceding the column address counter 111 in the DRAM according to the second embodiment. Therefore, the output of the column address counter 111 is later than that in the first embodiment, whereas the timing provided to input data to a column decoder 116 or a redundant column decoder 115 is substantially identical to the first embodiment. As a result, an operation effect similar to the first embodiment is obtained.

A read operation and a write operation at AL=0, of the DRAM according to the second embodiment can easily be estimated from the read operation (see FIG. 10) and the write operation (see FIG. 11) in the first embodiment. Since a write operation thereof at AL=1 can also be estimated with ease from the read operation (see FIG. 19) and the write operation (see FIG. 13) employed in the first embodiment, the description thereof will be omitted herein.

The second embodiment has an advantage in that the total number of bits for the timing adjustment circuit may be half or less as compared with the first embodiment. Namely, the number of bits for the timing adjustment circuit 224 employed in the second embodiment is identical to that for the first timing adjustment circuit 124 employed in the first embodiment, e.g., the number of bits like 9×4=36 bits. The second timing adjustment circuit 125 having the number of bits identical to the number of auxiliary or spare memory arrays (e.g., 32×4 =128) becomes unnecessary. Since, however, the timing adjustment circuit 224 is located on the preceding-stage side as compared with the first embodiment, the effect of shortening a cycle time is slightly reduced.

Namely, in FIG. 14B showing the timings employed in the first embodiment, the time t1 required to take the column address in the column address latch 110 according to YCLK1 since the entry of the READ command located in the second cycle can be executed in a second cycle even in the case of the second embodiment. Since, however, the time t2 required to input the column address located in the second cycle to the column predecoder 114 in the first embodiment enters a third cycle in the case of the second embodiment, the effect of shortening a cycle time is reduced as compared with the first embodiment.

Figure 20:
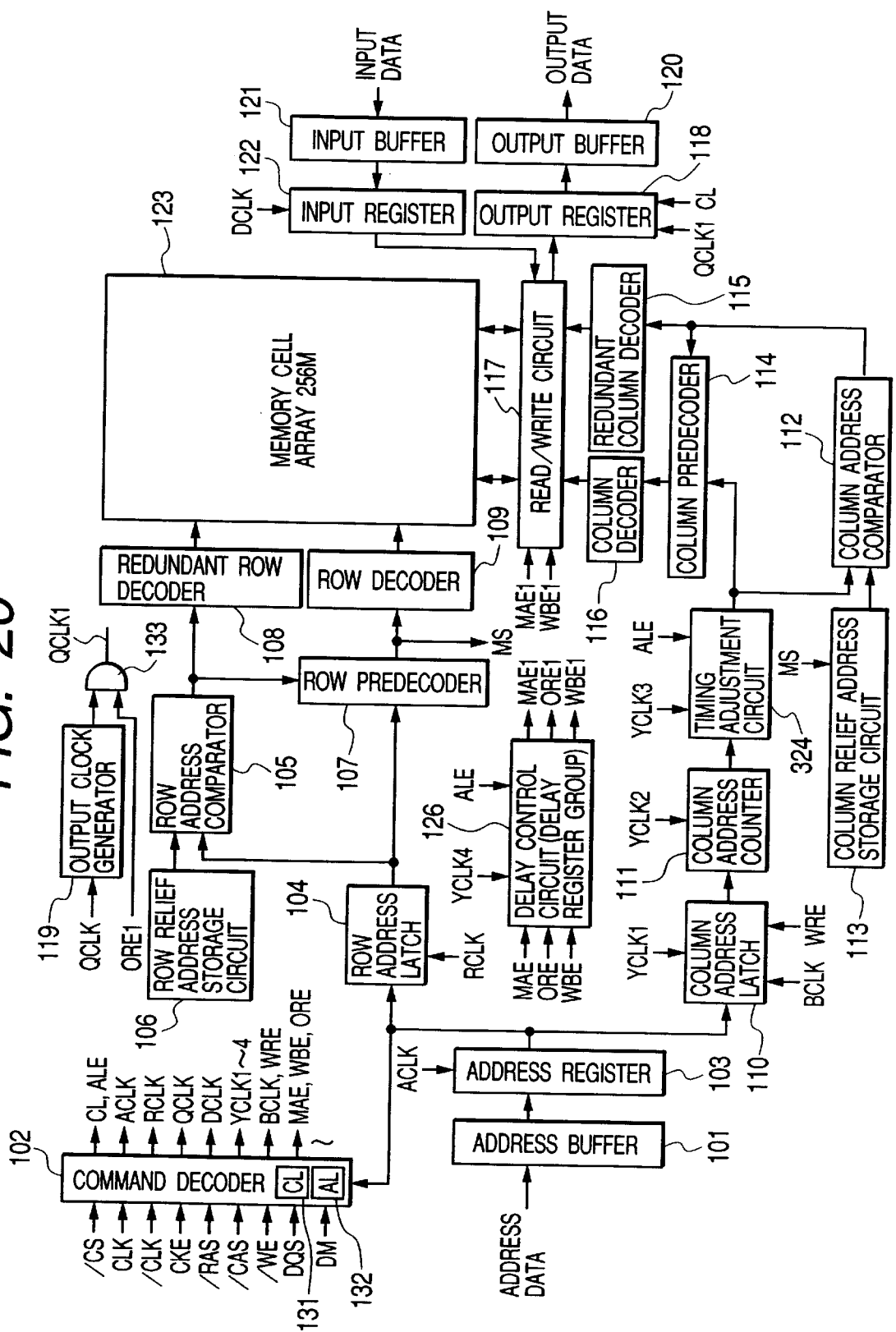
FIG. 20 is a block configurational diagram illustrating a third embodiment of a double data rate synchronous DRAM to which the present invention is applied.

FIG. 20 shows a third embodiment of a double data rate synchronous DRAM to which the present invention is applied. The present third embodiment is one wherein in the first embodiment (see FIG. 1), the timing adjustment circuits 124 and 125 provided in the stage preceding the column predecoder 114 are provided as 324 between the column address counter 111 and the column predecoder 114. Since the third embodiment is similar in other configurations to the first embodiment, the same circuit blocks are respectively identified by the same reference numerals and the description of certain common ones will therefore be omitted.

Figure 21:
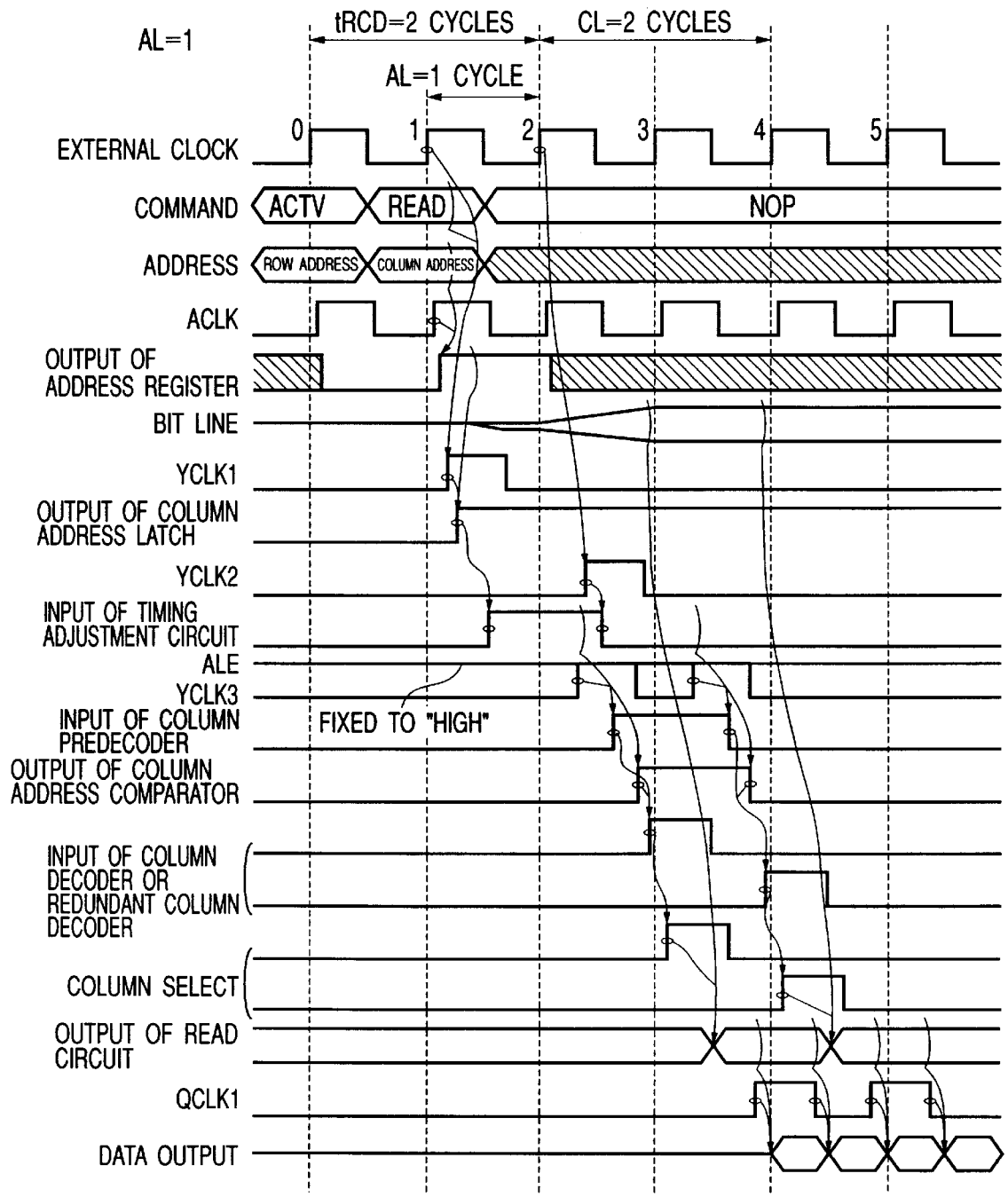
FIG. 21 is a timing chart for describing internal major signals at a read operation of the double data rate synchronous DRAM shown in FIG. 20 where tRCD is 2 cycles, a CAS latency is 2 cycles, and a column command advanced latency (AL) is 1 cycle.

FIG. 21 shows a timing chart for describing a read operation at the time that an AL latency is 1 on the assumption that tRCD is 2 cycles and a CAS latency is 2 cycles. FIG. 21 corresponds to FIG. 12 showing the timing chart employed in the first embodiment.

As is apparent from the comparison with FIG. 12, the timing adjustment circuit 324 is provided in a stage preceding a column address comparator 112 in the DRAM according to the third embodiment. Therefore, the output of the column address comparator 112 is later than that in the first embodiment, whereas the timing provided to input data to a column decoder 116 or a redundant column decoder 115 is substantially identical to the first embodiment. As a result, an operation effect similar to the first embodiment is obtained.

A read operation and a write operation at AL=0, of the DRAM according to the third embodiment can easily be estimated from the read operation (see FIG. 10) and the write operation (see FIG. 11) in the first embodiment. Since a write operation thereof at AL=1 can also be estimated with ease from the read operation (see FIG. 21) and the write operation (see FIG. 13) employed in the first embodiment, the description thereof will be omitted herein.

In the present embodiment, the times cannot be allocated efficiently when AL=1 as compared with the first embodiment shown in FIG. 1. Further, the time required between the input of an ACTV command and the amplification of each bit line is shortened. Even when a column path is rate-controlled when AL=0, the effect of shortening a cycle time is small. However, the number of the timing adjustment circuits can be reduced by the number of comparator outputs. This can contribute to a reduction in chip size. As compared with the second embodiment, the times can be allocated efficiently when AL=1, and the time required between the entry of the ACTV command and the amplification of each bit line is shortened. Further, when the column path is rate-controlled at AL=0, the cycle time can be shortened. The number of bits for the timing adjustment circuit 324 is identical to that in the second embodiment.

Figure 22:
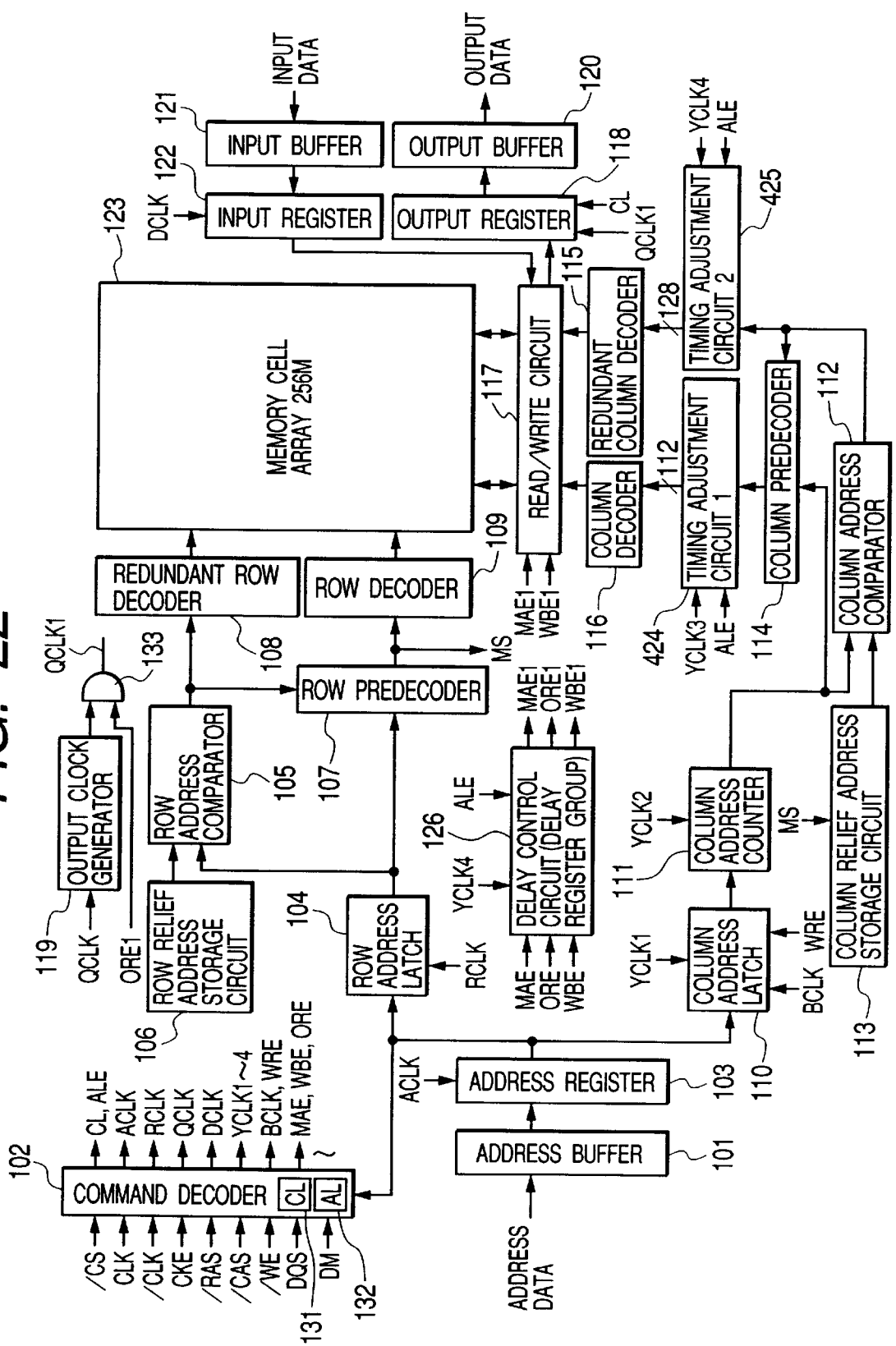
FIG. 22 is a block configurational diagram showing a fourth embodiment of a double data rate synchronous DRAM to which the present invention is applied.

FIG. 22 shows a fourth embodiment of a double data rate synchronous DRAM to which the present invention is applied. The present fourth embodiment is one wherein in the first embodiment (see FIG. 1), the timing adjustment circuits 124 and 125 provided in the stage preceding the column predecoder 114 are provided as 424 and 425 in a stage subsequent to the column predecoder 114. Since the fourth embodiment is similar in other configurations to the first embodiment, the same circuit blocks are respectively identified by the same reference numerals and the description of certain common ones will therefore be omitted.

Figure 23:
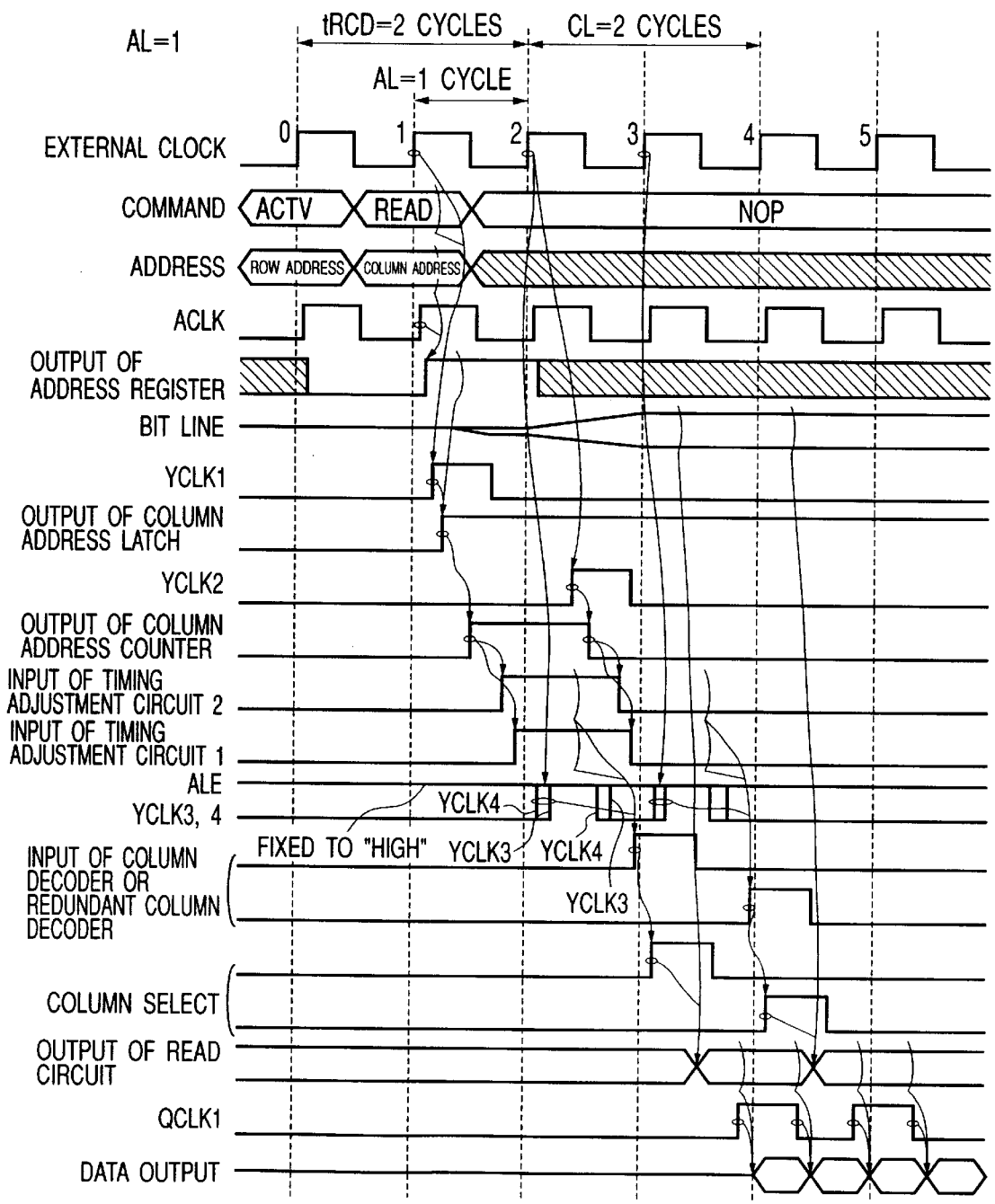
FIG. 23 is a timing chart for describing internal major signals at a read operation of the double data rate synchronous DRAM shown in FIG. 22 where tRCD is 2 cycles, a CAS latency is 2 cycles, and a column command advanced latency (AL) is 1 cycle.

FIG. 23 shows a timing chart for describing a read operation at the time that an AL latency is 1 on the assumption that tRCD is 2 cycles and a CAS latency is 2 cycles. FIG. 23 corresponds to FIG. 12 showing the timing chart employed in the first embodiment.

As is apparent from the comparison with FIG. 12, the timing adjustment circuits 424 and 425 are provided in the stage subsequent to the column predecoder 114 in the DRAM according to the fourth embodiment. However, timings for signals shown in FIG. 23 are perfectly identical to the timing chart shown in FIG. 12 used for the first embodiment. As a result, an operation effect similar to the first embodiment is obtained.

A read operation and a write operation at AL=0, of the DRAM according to the fourth embodiment can easily be estimated from the read operation (see FIG. 10) and the write operation (see FIG. 11) in the first embodiment. Since a write operation thereof at AL=1 can also be estimated with ease from the read operation (see FIG. 23) and the write operation (see FIG. 13) employed in the first embodiment, the description thereof will be omitted herein.

In the present embodiment, the times can be allocated efficiently when AL=1 in a manner similar to the first embodiment shown in FIG. 1. Further, the time required between the input of an ACTV command and the amplification of each bit line is shortened. When a column path is rate-controlled when AL=0, a cycle time can be shortened owing to the effect of performing pipelining when AL=1 or more. However, since the present embodiment has the timing adjustment circuits corresponding to a predecoded column address and the number of comparator outputs, the number of bits for the timing adjustment circuits 424 and 425 increases as compared with the first embodiment.

Figure 24:
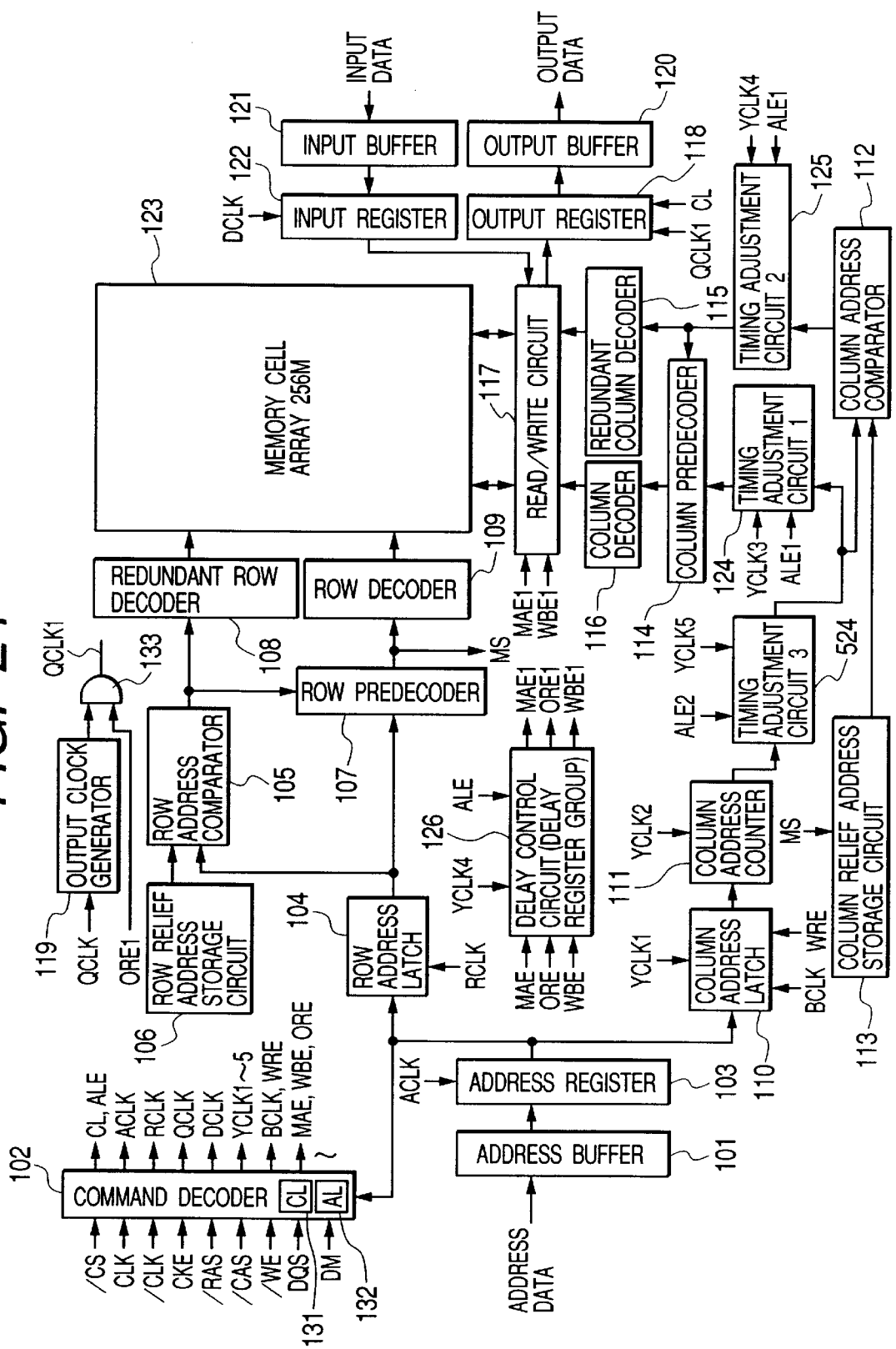
FIG. 24 is a block configurational diagram showing a fifth embodiment of a double data rate synchronous DRAM to which the present invention is applied.

FIG. 24 shows a fifth embodiment of a double data rate synchronous DRAM to which the present invention is applied. The present fifth embodiment is one wherein a timing adjustment circuit 524 is provided even between the column address counter 111 and the column address comparator 112 in a manner similar to the third embodiment in addition to the timing adjustment circuits 124 and 125 provided in the stage preceding the column predecoder 114 in the first embodiment (see FIG. 1). Since the fifth embodiment is similar in other configurations to the first embodiment, the same circuit blocks are respectively identified by the same reference numerals and the description of certain common ones will therefore be omitted.

Figure 25:
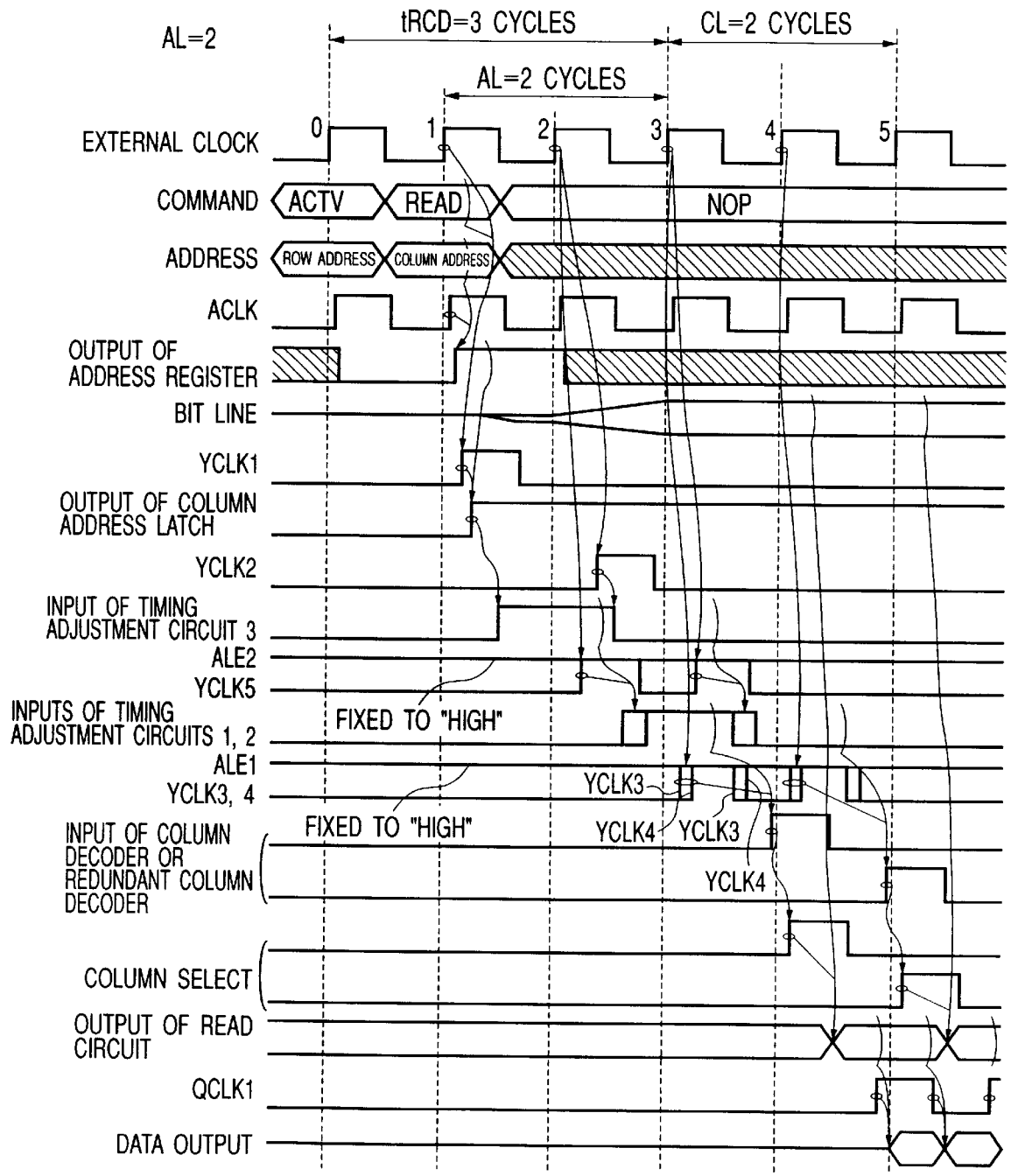
FIG. 25 is a timing chart for describing internal major signals at a read operation of the double data rate synchronous DRAM shown in FIG. 24 where tRCD is 2 cycles, a CAS latency is 2 cycles, and a column command advanced latency (AL) is 2 cycles.

FIG. 25 shows a timing chart for describing a read operation at the time that an AL latency is 2 on the assumption that tRCD is 3 cycles and a CAS latency is 2 cycles.

As shown in FIG. 25, a row address is taken in simultaneously with the entry of an ACTV command upon the read operation at AL=2, and then decoded to thereby select a word line. Thereafter, data stored in a memory cell is outputted to its corresponding bit line. When the bit line is fully set up, a sense amplifier is started up to amplify the potential on the bit line.

When tRCD is 3 cycles and AL=2, a READ command is entered after one cycle since the entry of the ACTV command. Simultaneously with it, a column address is taken in from the address buffer 101. In response to the READ command, the column address is latched into the address register 103 according to a clock ACLK outputted from the command decoder 102. Further, the column address is latched into the column address latch 110 according to a clock YCLK1 outputted from the command decoder 102 in response to the READ command. Since a write register enable signal WRE generated by the command decoder 102 in response to the READ command is fixed low, the column address is outputted from the column address latch 110 without being delayed by one cycle.

Thereafter, the column address passes through the column address counter 111 and is inputted to the timing adjustment circuit 524, where it is latched therein. In response to a clock subsequent to the elapse of one cycle since the entry of the READ command, YCLK5 is generated by the command decoder 102 and inputted to the timing adjustment circuit 524. The column address, which has been latched into the timing adjustment circuit 524, is outputted in response to the rising edge of the YCLK5. Thus, the column address is delayed one cycle. Afterwards, the column address is inputted to the column address comparator 112 where it is compared with a relief address stored in the column relief address storage circuit 113 and thereby the coincidence or non-coincidence of the two is determined. Since ALE1 is fixed high when AL=2, the output from the comparator 112 is latched into the timing adjustment circuit 125, and the output (the output of the column address counter 111) from the timing adjustment circuit 524 is latched into the timing adjustment circuit 124.

Further, the command decoder 102 generates YCLK3 and YCLK4 in response to a clock subsequent to the elapse of two cycles since the entry of the READ command. They are inputted to the timing adjustment circuits 124 and 125 respectively. The output of the column address counter 111, which has been latched into the timing adjustment circuit 124, and the output of the comparator 112, which has been latched into the timing adjustment circuit 125, are respectively outputted in response to the rising edges of the YCLK3 and YCLK4. Thus, the output of the column address counter 111 and the output of the comparator 112 are respectively delayed by one cycle.

Thereafter, when they are found to coincide with each other as a result of the comparison by the comparator 112, the column predecoder 114 is deactivated according to the output of the timing adjustment circuit 125 so that a redundant bit line is selected by the redundant column decoder 115. On the other hand, when they are found not to coincide with each other, the column predecoder 114 is activated according to the output of the timing adjustment circuit 125, and hence the output of the timing adjustment circuit 124 is predecoded by the column predecoder 114. Further, the output of the column predecoder 114 is decoded by the column decoder 116 to select the corresponding bit line pair. Since, at this time, a delay corresponding to two cycles is already included in a column address path, the corresponding bit line is fully amplified in potential and hence correct data can be read out. Owing to the selection of the bit line pair, data on the bit line is thereafter inputted to the read circuit 117 where the data is amplified again, followed by delivery to the output register 118.

Figure 26:
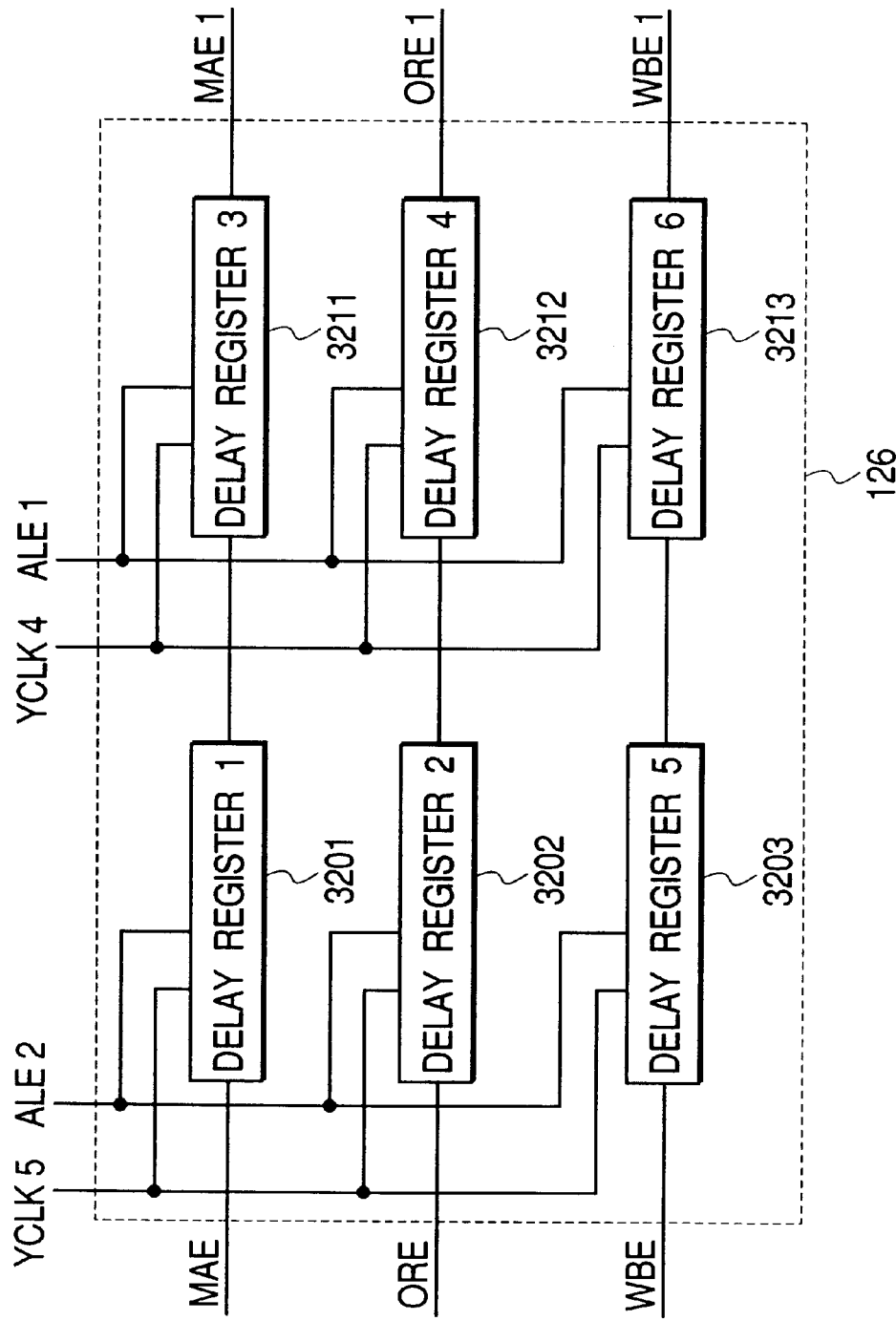
FIG. 26 is a circuit diagram showing a specific configurational example of a delay control circuit employed in the embodiment shown in FIG. 24.

In response to a CAS latency information signal CL sent from the command decoder 102 and QCLK1 generated by the output clock generator 119, the output register 118 sends the data to the output buffer 120 from which the data is outputted to the outside. In the double data rate synchronous DRAM at this time, the data is outputted on both the rising and falling edges of the clock. A read circuit enable signal MAE and an output clock generator enable signal ORE are outputted from the command decoder 102 in response to the READ command. They pass through first and second delay registers 3201 and 3202 and third and fourth delay registers 3211 and 3212 lying within a delay control circuit 126 shown in FIG. 26 and are respectively inputted to the read circuit 117 and the output clock generator 119 as MAE1 and ORE1. When AL=2 (since ALE1 and ALE2 are fixed high), MAE and ORE are respectively delayed two cycles within the first and second delay registers 3201 and 3202 and the third and fourth delay registers 3211 and 3212 and thereafter outputted as MAE1 and ORE1.

In the present embodiment, the efficient allocation of times can be implemented when AL=2 in a manner similar to the first embodiment shown in FIG. 1. Further, the time required between the input of the ACTV command and the amplification of each bit line is shortened. When a column path is rate-controlled when AL=0, a cycle time can be shortened owing to the effect of performing pipelining when AL=1 or more. However, a circuit scale slightly increases as compared with the first embodiment.

Figure 27:
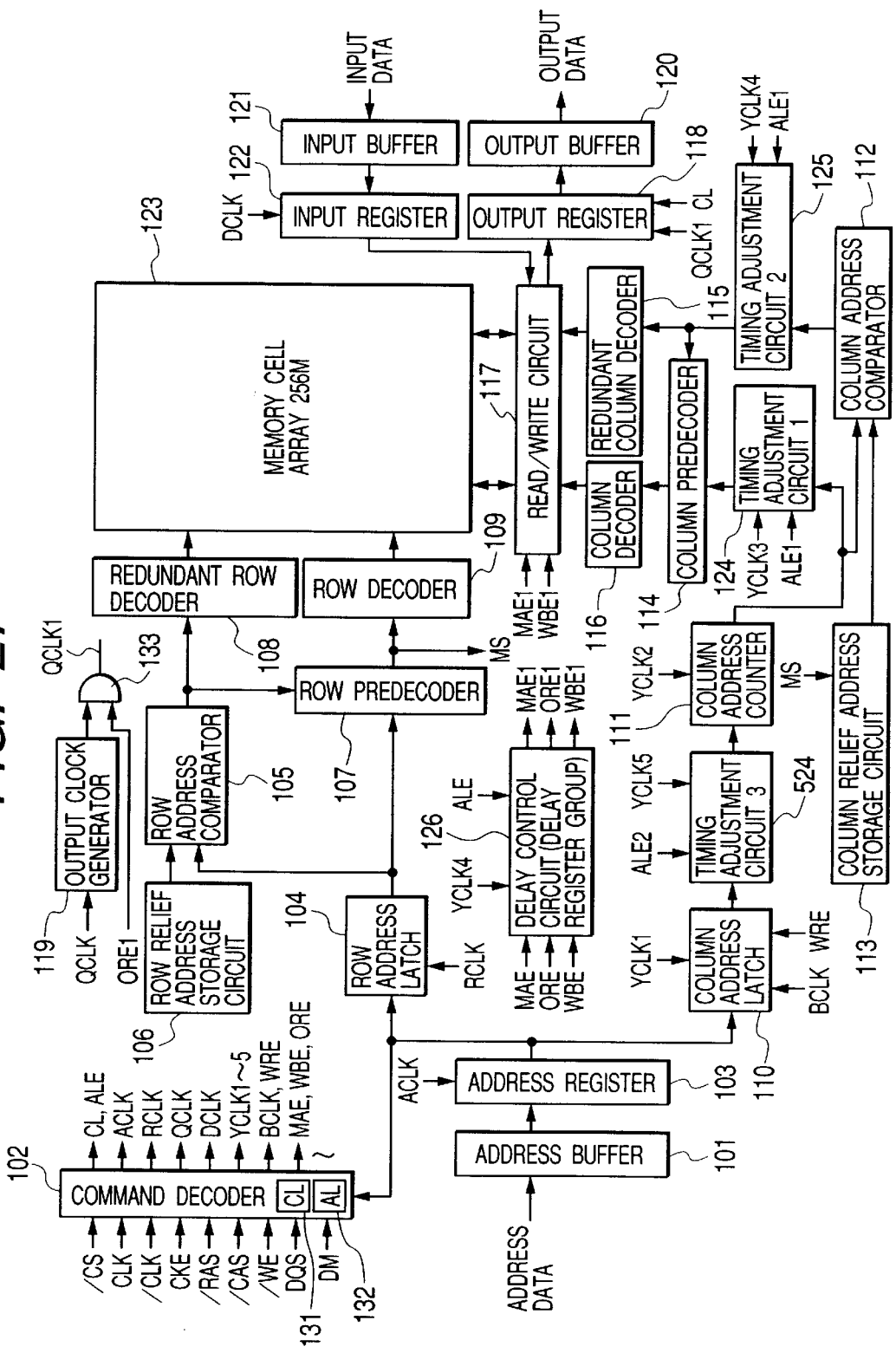
FIG. 27 is a block configurational diagram showing a sixth embodiment of a double data rate synchronous DRAM to which the present invention is applied.

FIG. 27 shows a sixth embodiment of a double data rate synchronous DRAM to which the present invention is applied. The present embodiment is one wherein in the fifth embodiment (see FIG. 24), the timing adjustment circuit 524 provided immediately after the column address counter 111 is provided between the column address latch 110 and the column address counter 111. In the double data rate synchronous DRAM according to the sixth embodiment, the input of each command is also set as a double data rate as well as read/write data.

Figure 28:
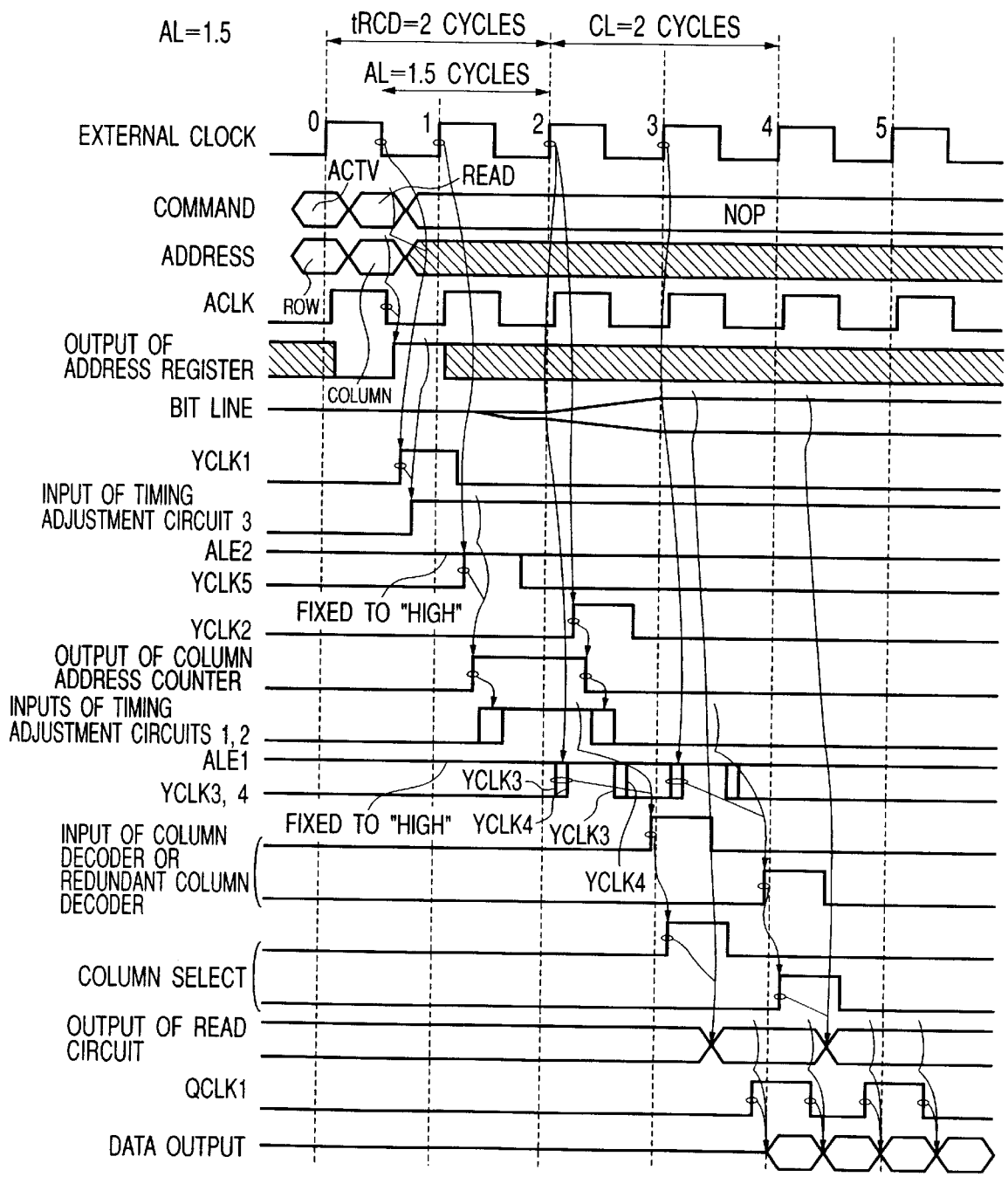
FIG. 28 is a timing chart for describing internal major signals at a read operation of the double data rate synchronous DRAM shown in FIG. 27 where tRCD is 2 cycles, a CAS latency is 2 cycles, and a column command advanced latency (AL) is 1.5 cycles.
Figure 29:
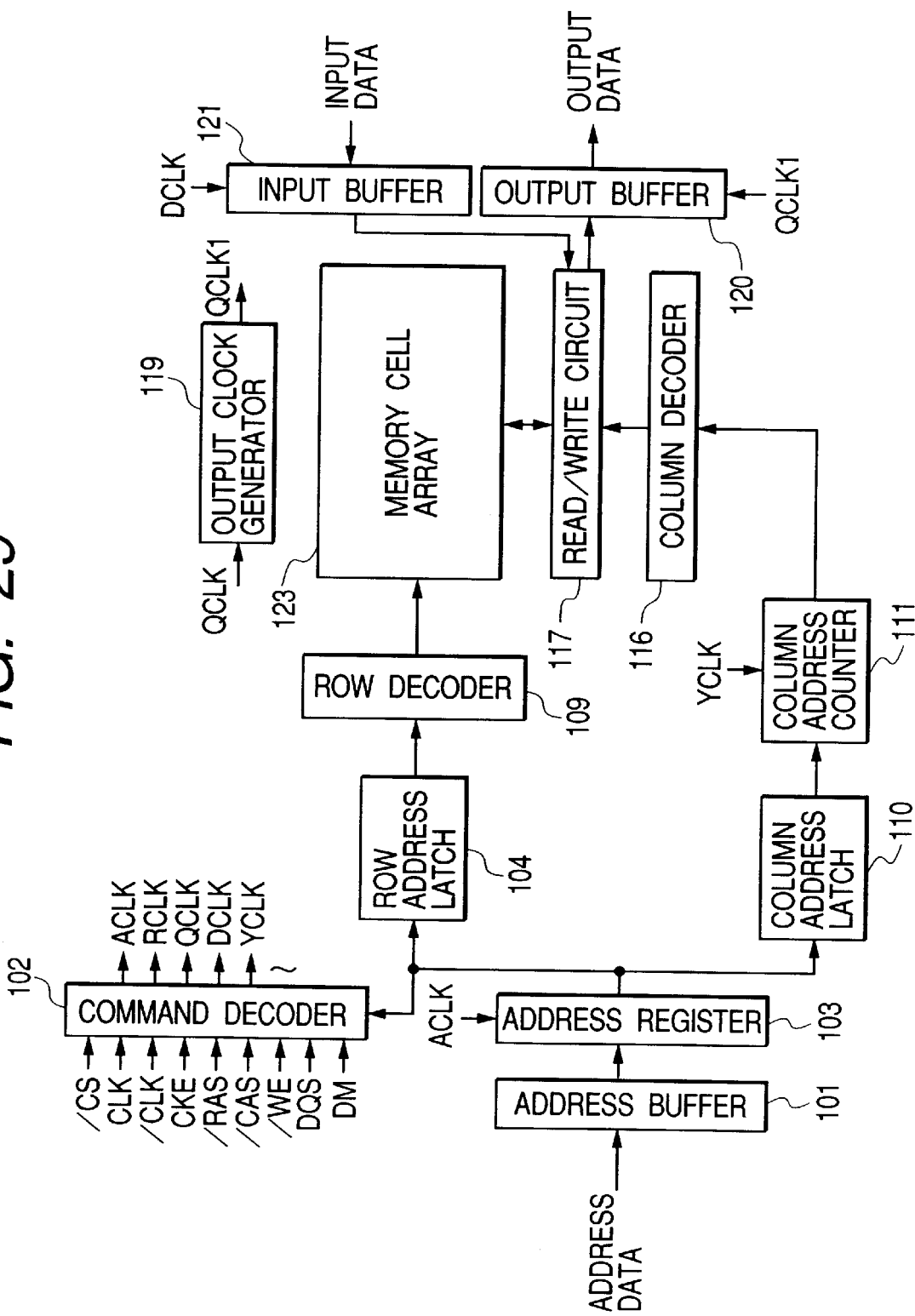
FIG. 29 is a block diagram showing a schematic configuration of a conventional double data rate synchronous DRAM.
Figure 30:
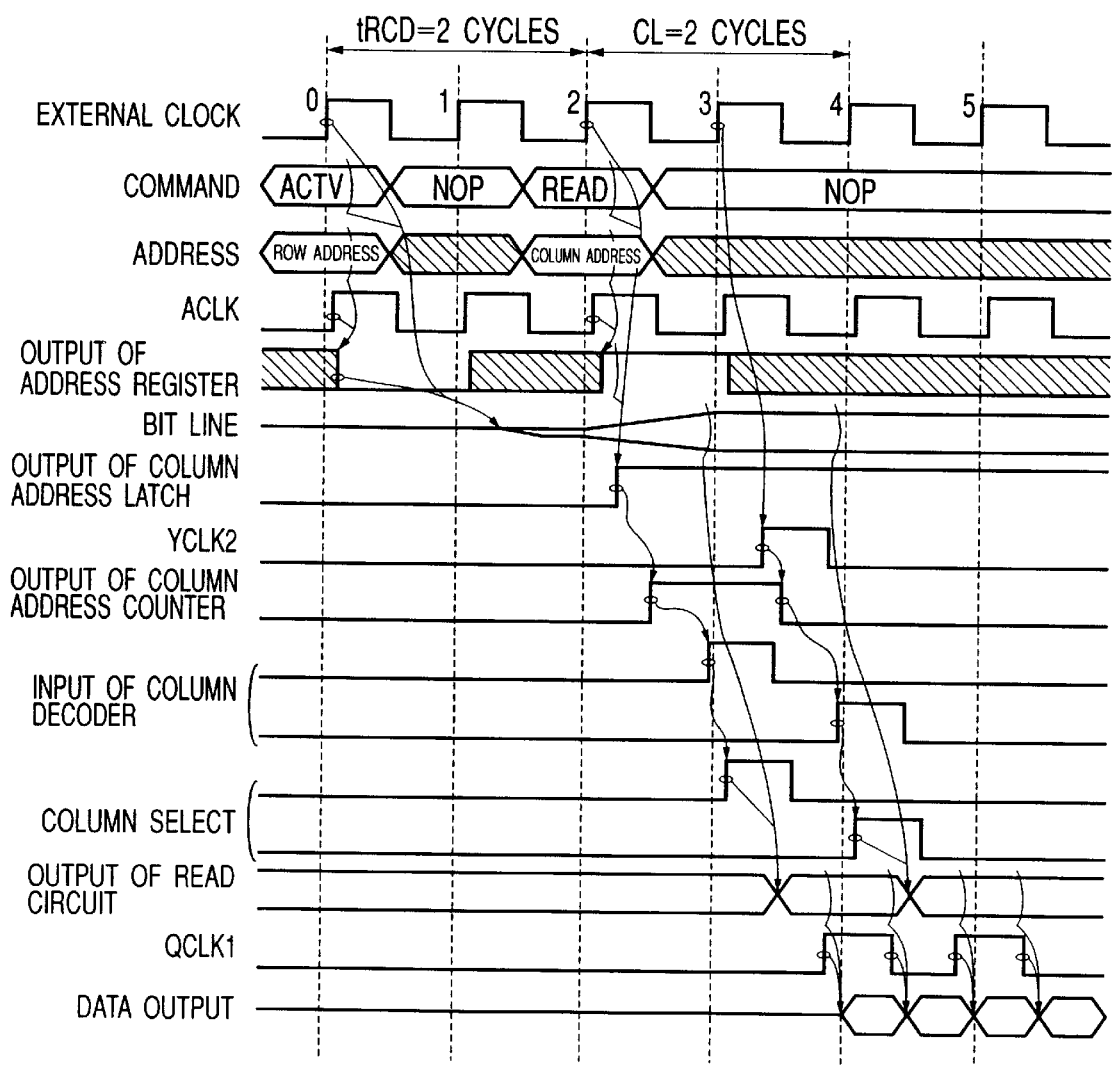
FIG. 30 is a timing chart for describing internal major signals at a read operation of the conventional double data rate synchronous DRAM shown in FIG. 29 where tRCD is 2 cycles, and a CAS latency is 2 cycles.
Figure 31:
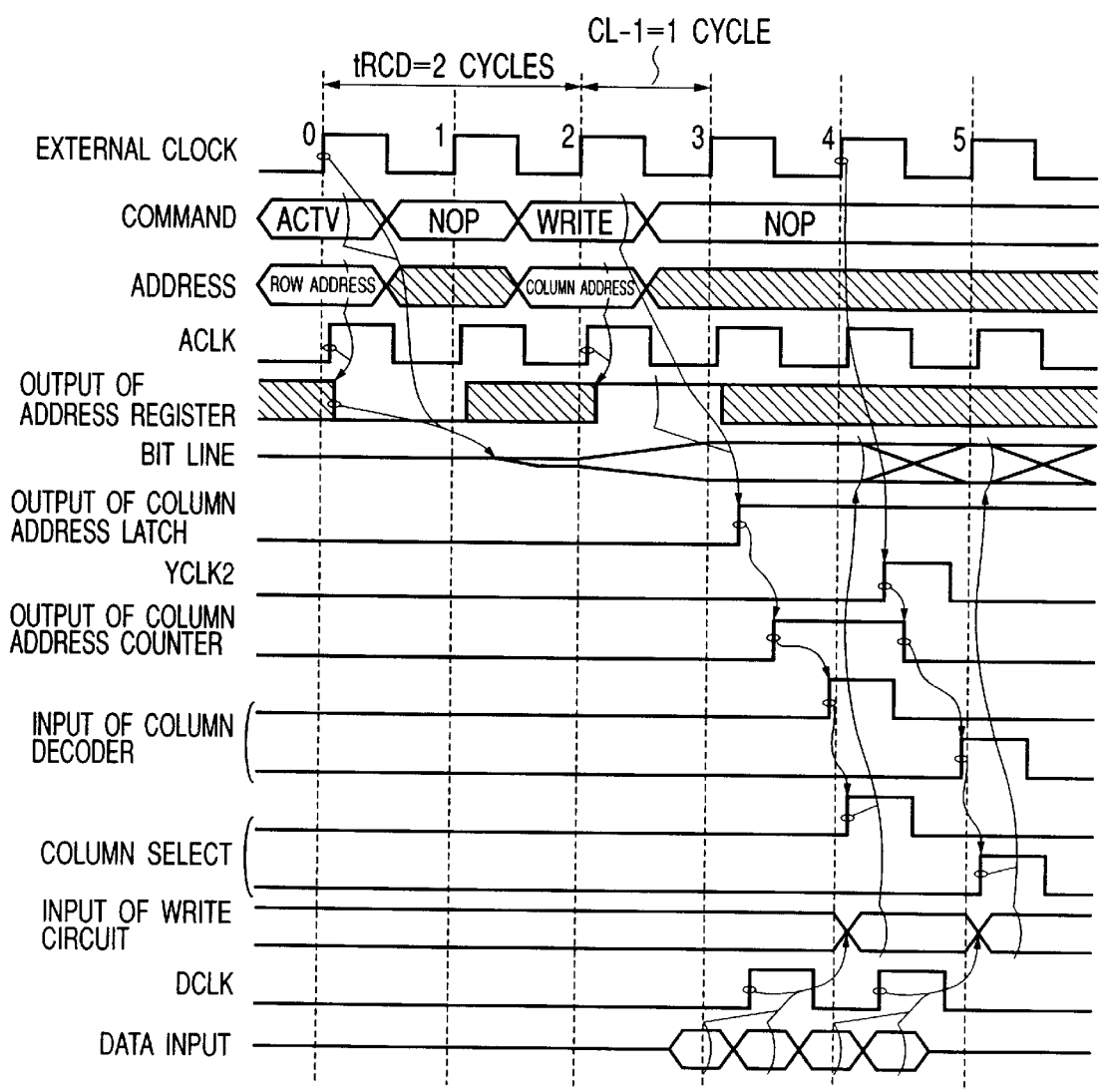
FIG. 31 is a timing chart for describing internal major signals at a write operation of the conventional double data rate synchronous DRAM under the same conditions as shown in FIG. 30.

FIG. 28 shows a timing chart for describing a read operation at the time that an AL latency is 1.5 on the assumption that tRCD is 2 cycles and a CAS latency is 2 cycles.

As shown in FIG. 28, a row address is taken in simultaneously with the entry of an ACTV command upon the read operation at AL=1.5, and then decoded to thereby select a word line. Thereafter, data stored in a memory cell is outputted to its corresponding bit line. When the bit line is fully set up, a sense amplifier is started up to amplify the potential on the bit line.

When AL=1.5, a READ command is entered after 0.5 cycle since the entry of the ACTV command. Simultaneously with it, a column address is taken in from the address buffer 101. In response to the READ command, the column address is latched into the address register 103 according to ACLK outputted from the command decoder 102. Further, the column address is latched into the column address latch 110 according to YCLK1 outputted from the command decoder 102 in response to the READ command. Since a write register enable signal WRE generated by the command decoder 102 in response to the READ command is fixed low at this time, the column address is outputted from the column address latch 110 without being delayed by one cycle and latched into the timing adjustment circuit 524.

In response to a clock subsequent to the elapse of one cycle since the entry of the READ command, YCLK5 is generated by the command decoder 102 and inputted to the timing adjustment circuit 524. The column address, which has been latched into the timing adjustment circuit 524, is outputted in response to the rising edge of the YCLK5. Thus, the column address is delayed 0.5 cycle. Afterwards, the column address is inputted to the column address comparator 112 where it is compared with a relief address stored in the column relief address storage circuit 113 and thereby the coincidence or non-coincidence of the two is determined. Since ALE1 is fixed high when AL=1.5, the output from the comparator 112 is latched into the timing adjustment circuit 125, and the output from the column address counter 111 is latched into the timing adjustment circuit 124.

Further, the command decoder 102 generates YCLK3 and YCLK4 in response to a clock subsequent to the elapse of two cycles since the entry of the READ command. They are inputted to the timing adjustment circuits 124 and 125 respectively. The output of the column address counter 111, which has been latched into the timing adjustment circuit 124, and the output of the comparator 112, which has been latched into the timing adjustment circuit 125, are respectively outputted in response to the rising edges of the YCLK3 and YCLK4. Thus, the output of the column address counter 111 and the output of the comparator 112 are respectively delayed one cycle.

Thereafter, when they are found to coincide with each other as a result of the comparison by the comparator 112, the column predecoder 114 is deactivated according to the output of the timing adjustment circuit 125 so that a redundant bit line is selected by the redundant column decoder 115. On the other hand, when they are found not to coincide with each other, the column predecoder 114 is activated according to the output of the timing adjustment circuit 125, and hence the output of the timing adjustment circuit 124 is predecoded by the column predecoder 114. Further, the output of the column predecoder 114 is decoded by the column decoder 116 to select the corresponding bit line pair. Since, at this time, a delay corresponding to 1.5 cycles is already included in a column address path, the corresponding bit line is fully amplified in potential and hence correct data can be read out. Owing to the selection of the bit line pair, data on the bit line is thereafter inputted to the read circuit 117 where the data is further amplified, followed by delivery to the output register 118. Further, the data is outputted to the outside of a chip through the output buffer 120.

In addition to the effect of the fifth embodiment, the present embodiment has an advantage that it can cope even with the case in which a double data rate is applied even to the input of each command as well as to read/write data.

In the double data rate synchronous DRAM according to the embodiment as described above, even if the timing provided to input a column command is advanced, no bit line pair is selected before read data is not amplified by a corresponding sense amplifier. It is therefore possible to read correct data. Further, since the bit line is selected after correct write data has been inputted to a write circuit, correct data can be written therein.

Since no bit line pair is selected before read data is amplified by the corresponding sense amplifier even if a column command advanced latency is changed, correct data can be read out. Further, since no bit line pair is selected before correct write data is inputted to the write circuit, correct data can be written therein.

Further, the time spent between the entry of an active command and the amplification of each bit line is shortened. When a column path rate-controls a cycle time when the column command advanced latency AL=0, the cycle time is shortened by a pipelining effect when AL=1, so that a data transmission rate can be speeded up.

While the invention made above by the present inventors has been described specifically by the embodiments, the present invention is not limited to the embodiments. It is needless to say that various changes can be made thereto within the scope not departing from the substance thereof. For instance, the first embodiment (see FIG. 1), the second embodiment (see FIG. 18), the fourth embodiment (see FIG. 22), the fifth embodiment (see FIG. 24) and the sixth embodiment (see FIG. 27) may omit the column address counters 111 respectively. Any of the embodiments has described the case where the cycle tRCD from the entry of the active command to the entry of the column command is 2 cycles and the column command advanced latency is set to "0", or "1" or "1.5". However, when tRCD is 3 cycles or more, for example, the column command advanced latency can be set to "2" or more. In such a case, a memory or the like is considered which is configured so that, for example, addresses are time-divisionally taken inside a chip in parts over three times or more.

While the above description has principally been made of the case in which the invention made by the present inventors is applied to the double data rate synchronous DRAM which belongs to the field of application corresponding to the background of the invention, the present invention is not limited to it. The present invention can generally be applied to a semiconductor memory, particularly, a clock synchronous semiconductor memory.

Advantageous effects obtained by a typical one of the inventions disclosed in the present application will be described in brief as follows:

According to the present invention, a clock synchronous semiconductor memory device can be realized which is capable of reading and writing correct data even when a read command and a write command are inputted in advanced manner, and a column address is inputted in advanced manner. Further, a clock synchronous semiconductor memory device can be implemented which is capable of shortening a cycle time and speeding up a data transmission rate.

We claim:

1. A semiconductor memory device comprising:
   a memory-cell array having a plurality of word lines and a plurality of bit lines to which memory cells are connected;
   a row address latch circuit which latches a row address;
   a row decoder which decodes the row address to thereby select a word line lying within said memory cell array;
   a column address latch circuit which latches a column address;
   a column decoder which decodes the column address to thereby select at least one bit line lying within said memory cell array;
   an output buffer which outputs data read from said memory cell array;
   an input buffer which takes in an input data;
   a first register capable of setting values for specifying a timing provided to take the input data in said input buffer and a timing provided to output the data from said output buffer;
   a second register capable of setting a value for specifying a timing provided to input a data read command or a data write command; and
   a timing adjustment circuit provided on a column address signal path between said column address latch circuit and said column decoder and for delaying a signal by a predetermined time according to the value set to said second register,
   wherein said input buffer and said output buffer are configured so as to determine operating timings according to the values set to said first register.

2. The semiconductor memory device according to claim 1, further including a circuit which generates an internal control signal used to control each internal circuit, based on a control signal supplied from outside, and a delay control circuit for delaying the internal control signal by a predetermined cycle time according to the value set to said second register, wherein said timing adjustment circuit is controlled by the internal control signal adjusted by said delay control circuit so as to make a timing adjustment of a column address signal.

3. The semiconductor memory device according to claim 2, further including a circuit which generates a signal for designating an operation timing of said output buffer, based on the internal control signal, wherein said circuit is controlled by the internal control signal generated by said delay control circuit and is capable of delaying a signal generated according to the value set to said second register.

4. The semiconductor memory device according to claim 1, further including a column address counter which automatically updates the column address latched into said column address latch circuit, wherein said timing adjustment circuit is provided on a column address signal path between said column address counter and said column decoder.

5. The semiconductor memory device according to claim 1, further including a column address counter which automatically updates the column address latched into said column address latch circuit, wherein said timing adjustment circuit is provided between said column address latch circuit and said column address counter.

6. The semiconductor memory device according to claim 1, further including a plurality of spare memory arrays capable of being substituted for normal memory arrays in said memory cell array, a relief address storage circuit capable of storing addresses lying in a memory array having a defect, an address comparator which compares an input column address with each of the addresses stored in said relief address storage circuit, a redundant column decoder which decodes a signal based on the result of comparison by said address comparator to thereby select any of the spare memory arrays, and a column address counter which updates the column address latched into said column address latch circuit,
   wherein said address comparator compares an address outputted from said column address counter with each of the addresses stored in said relief address storage circuit, and
   wherein a second timing adjustment circuit is provided on a signal path between said address comparator and said redundant column decoder.

7. The semiconductor memory device according to claim 6, further including a column predecoder for predecoding the column address, which is provided in a stage preceding said column decoder,
   wherein said timing adjustment circuit is provided between said column address counter and said column predecoder and said second timing adjustment circuit is provided between said address comparator and said column predecoder, respectively.

8. The semiconductor memory device according to claim 6, further including a column predecoder for predecoding the column address, which is provided in a stage preceding said column decoder,
   wherein said timing adjustment circuit is provided between said column predecoder and said column decoder and said second timing adjustment circuit is provided between said address comparator and said column decoder, respectively.

9. The semiconductor memory device according to claim 6, wherein a third timing adjustment circuit is provided between said column address latch circuit and said address comparator.

10. The semiconductor memory device according to claim 1, which is operated based on a command supplied from the outside of said semiconductor memory device, wherein the value set to said second register is a value for specifying the number of cycles in which the read or write command inputted after the entry of an operation start command is inputted in an advanced manner.

11. The semiconductor memory device according to claim 10, wherein the value set to said second register is set based on the state of a terminal to which an external address is inputted when the command supplied from the outside of said semiconductor memory device provides instructions for setting thereof to said second register.

12. The semiconductor memory device according to claim 1, wherein said timing adjustment circuit comprises a delay path having signal delay means, a through path which has no signal delay means and outputs an input signal as it is, and switching means which selects any of said plural paths, for causing the input signal to pass therethrough according to the value set to said second register.

13. The semiconductor memory device according to claim 12, wherein master slave-configured latch circuits each operated by the internal control signal are placed in the delay path having the signal delay means of said timing adjustment circuit.

14. A semiconductor memory device comprising:
   a circuit which adjusts a signal transmission time for a column address signal path so as to be operable in accordance with both cases in which the number of clock cycles from the input of an active command to the input of a read command is one clock cycle and more than one clock cycle.

15. A semiconductor memory device comprising:
   a circuit which adjusts a signal transmission time for a column address signal path so as to be operable in accordance with both cases in which the number of clock cycles from the input of an active command to the input of a write command is one clock cycle and more than one clock cycle.

16. A method of operating a semiconductor memory device synchronized with a clock signal and activated based on commands, comprising the steps:
   a step for inputting a first command with a first timing of the clock signal;
   a step for inputting a first address with the first timing;
   a step for inputting a second command with a second timing subsequent to a first clock cycle of the clock signal with respect to the first timing;
   a step for inputting a second address with the second timing;
   a first adjusting step for adjusting the time necessary to transmit the second address or a signal formed based on the second address;
   a step for inputting the first command with a third timing of the clock signal;
   a step for inputting a third address with the third timing;
   a step for inputting the second command with a fourth timing subsequent to a second clock cycle of the clock signal with respect to the third timing;
   a step for inputting a fourth address with the fourth timing; and
   a second adjusting step for adjusting the time necessary to transmit the fourth address or a signal formed based on the fourth address;
   wherein said first clock cycle and said second clock cycle are different from each other, and
   the adjustment time in said first adjusting step and the adjustment time in said second adjusting step are different from each other.

17. The method according to claim 16, wherein said first command is an active command, and said second command is a read command.

18. The method according to claim 16, wherein said first command is an active command, and said second command is a write command.

19. The method according to claim 16, wherein said semiconductor memory device is a synchronous DRAM.

20. The method according to claim 16, wherein said semiconductor memory device is a double data rate synchronous DRAM.

21. A method of operating a semiconductor memory device synchronized with a clock signal and activated based on commands, comprising the steps:
   a step for inputting an active command with a first timing of the clock signal;
   a step for inputting a first row address with the first timing;
   a step for inputting a read command with a second timing subsequent to a first clock cycle of the clock signal with respect to the first timing;
   a step for inputting a first column address with the second timing;
   a first adjusting step for adjusting the time necessary to transmit the first column address or a signal formed based on the first column address;
   a step for outputting data stored in a memory cell, corresponding to the first row address and the first column address to the outside of said semiconductor memory device;
   a step for inputting the active command with a third timing of the clock signal;
   a step for inputting a second row address with the third timing;
   a step for inputting the read command with a fourth timing subsequent to a second clock cycle of the clock signal with respect to the third timing;
   a step for inputting a second column address with the fourth timing;
   a second adjusting step for adjusting the time necessary to transmit the second column address or a signal formed based on the second column address; and
   a step for outputting data stored in a memory cell, corresponding to the second row address and the second column address to the outside of said semiconductor memory device,
   wherein said first clock cycle and said second clock cycle are different from each other, and
   the adjustment time in said first adjusting step and the adjustment time in said second adjusting step are different from each other.

22. A method of operating a semiconductor memory device synchronized with a clock signal and operated based on commands, comprising the steps:
   a step for inputting an active command with a first timing of the clock signal;
   a step for inputting a first row address with the first timing;
   a step for inputting a write command with a second timing subsequent to a first clock cycle of the clock signal with respect to the first timing;
   a step for inputting a first column address with the second timing;
   a first adjusting step for adjusting the time necessary to transmit the first column address or a signal formed based on the first column address;
   a step for inputting the active command with a third timing of the clock signal;

a step for inputting a second row address with the third timing;

a step for inputting the write command with a fourth timing subsequent to a second clock cycle of the clock signal with respect to the third timing;

a step for inputting a second column address with the fourth timing; and a second adjusting step for adjusting the time necessary to transmit the second column address or a signal formed based on the second column address, wherein said first clock cycle and said second clock cycle are different from each other, and the adjustment time in said first adjusting step and the adjustment time in said second adjusting step are different from each other.

23. The method according to claim 22, wherein said semiconductor memory device is a double data rate type clock synchronous memory.

24. A semiconductor memory device according to claim 14, wherein said circuit adjusts the signal transmission time for the column address signal path so as to be operable in accordance with both cases in which the number of clock cycles from the input of the active command to the input of the read command is one clock cycle and two clock cycles.

25. A memory device according to claim 15, wherein the circuit adjusts the signal transmission time for the column address signal path so as to be operable in accordance with both cases in which the number of clock cycles from the input of the active command to the input of the write command is one clock cycle and two clock cycles.

* * * * *